US012796177B2

(12) United States Patent
Choi et al.

(10) Patent No.: US 12,796,177 B2
(45) Date of Patent: Nov. 10, 2026

(54) DISPLAY APPARATUS INCLUDING BOTTOM METAL LAYER

(71) Applicant: SAMSUNG DISPLAY CO., LTD., Yongin-si (KR)

(72) Inventors: Yechan Choi, Yongin-si (KR); Kwangwoo Park, Yongin-si (KR); Jinyong Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 594 days.

(21) Appl. No.: 18/113,310

(22) Filed: Feb. 23, 2023

(65) Prior Publication Data

US 2023/0268465 A1 Aug. 24, 2023

(30) Foreign Application Priority Data

Feb. 24, 2022 (KR) ........................ 10-2022-0024571

(51) Int. Cl.
*H10H 20/831* (2025.01)
*H10D 86/40* (2025.01)
(Continued)

(52) U.S. Cl.
CPC ...... *H10H 20/8312* (2025.01); *H10D 86/423* (2025.01); *H10D 86/441* (2025.01);
(Continued)

(58) Field of Classification Search
CPC ............. H10H 20/8312; H10H 20/857; H10D 86/423; H10D 86/441; H10D 86/481;
(Continued)

(56) References Cited

U.S. PATENT DOCUMENTS 9,608,049 B2 3/2017 Lee
9,660,090 B2 * 5/2017 Yoon .................... H10K 59/126
(Continued)

FOREIGN PATENT DOCUMENTS

KR 1020150043890 A 4/2015
KR 1020170037786 A 4/2017
(Continued)

*Primary Examiner* — Tan N Tran

(74) *Attorney, Agent, or Firm* — CANTOR COLBURN LLP

(57) ABSTRACT

A display apparatus includes a substrate, a first silicon-based transistor including a first semiconductor layer and a first gate electrode. The first semiconductor layer includes a silicon-based semiconductor, and the first gate electrode overlaps the first semiconductor layer, at least one insulating layer on the first gate electrode, a first oxide-based transistor including a semiconductor layer. The semiconductor layer includes an oxide-based semiconductor, a first connection electrode electrically connecting the first semiconductor layer to the semiconductor layer of the first oxide-based transistor, and a bottom metal layer disposed between the substrate and the first silicon-based transistor and overlapping a portion of the first semiconductor layer of the first silicon-based transistor. A portion of the bottom metal layer overlaps a first connection point between a portion of the first semiconductor layer and the first connection electrode.

17 Claims, 15 Drawing Sheets

(51) Int. Cl.
*H10D 86/60* (2025.01)
*H10H 20/857* (2025.01)

(52) U.S. Cl.
CPC ........... *H10D 86/481* (2025.01); *H10D 86/60* (2025.01); *H10H 20/857* (2025.01)

(58) Field of Classification Search
CPC .. H10D 86/60; H10D 30/6723; H10D 86/411; H10D 86/451; H10D 30/6755; H10K 59/131; H10K 50/805; H10K 59/805; H10K 59/12; G09G 3/3266
See application file for complete search history.

(56) References Cited

U.S. PATENT DOCUMENTS

| | | | | |
|---|---|---|---|---|
| 9,897,879 | B2 * | 2/2018 | Liang | H10D 86/421 |
| 10,050,097 | B2 | 8/2018 | Oh et al. | |
| 10,062,743 | B2 | 8/2018 | Lee et al. | |
| 10,109,695 | B2 | 10/2018 | Choi et al. | |
| 10,263,060 | B2 * | 4/2019 | Noh | H10K 59/1216 |
| 10,868,096 | B2 | 12/2020 | Park et al. | |
| 12,183,668 | B2 * | 12/2024 | Sharma | H10D 30/67 |
| 2007/0029548 | A1 | 2/2007 | Yamazaki et al. | |
| 2015/0187959 | A1 | 7/2015 | Yoon | |
| 2018/0033849 | A1 | 2/2018 | Noh et al. | |
| 2019/0148476 | A1 | 5/2019 | Park et al. | |
| 2021/0202633 | A1 | 7/2021 | Song et al. | |
| 2021/0280659 | A1 | 9/2021 | Park et al. | |
| 2022/0093705 | A1 | 3/2022 | Kim et al. | |
| 2022/0254850 | A1 | 8/2022 | Kim et al. | |
| 2025/0017096 | A1 * | 1/2025 | Wang | H10K 59/8731 |

FOREIGN PATENT DOCUMENTS

| | | | |
|---|---|---|---|
| KR | 1020170049705 | A | 5/2017 |
| KR | 1020170071974 | A | 6/2017 |
| KR | 1020170127602 | A | 11/2017 |
| KR | 1020190104091 | A | 9/2019 |
| KR | 1020210085748 | A | 7/2021 |
| KR | 1020200085962 | A | 3/2022 |
| WO | 2020256248 | A1 | 12/2020 |

* cited by examiner

DISPLAY APPARATUS INCLUDING BOTTOM METAL LAYER

This application claims priority to Korean Patent Application No. 10-2022-0024571, filed on Feb. 24, 2022, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Generally, in a display apparatus including a light-emitting diode, thin-film transistors are arranged in a display area to control brightness and the like of the light-emitting diode. The thin-film transistors control a light-emitting diode corresponding thereto to emit light of a preset color by a data signal, a driving voltage, and a common voltage transferred thereto.

SUMMARY

Embodiments include a display apparatus that is strong against external impacts and flexible. However, such a technical problem is an example, and the disclosure is not limited thereto.

Additional features will be set forth in part in the description which follows and, in part, will be apparent from the description, or may be learned by practice of the presented embodiments of the disclosure.

In an embodiment of the disclosure, a display apparatus includes a substrate, a first silicon-based transistor disposed over the substrate and including a first semiconductor layer and a first gate electrode. The first semiconductor layer includes a silicon-based semiconductor, and the first gate electrode overlaps the first semiconductor layer, at least one insulating layer on the first gate electrode, a first oxide-based transistor including a semiconductor layer on the at least one insulating layer. The semiconductor layer includes an oxide-based semiconductor, a first connection electrode electrically connecting the first semiconductor layer of the first silicon-based transistor to the semiconductor layer of the first oxide-based transistor, and a bottom metal layer disposed between the substrate and the first silicon-based transistor and overlapping the first semiconductor layer of the first silicon-based transistor. A portion of the bottom metal layer overlaps a first connection point between a portion of the first semiconductor layer and the first connection electrode.

In an embodiment, the first semiconductor layer may include a channel region that is bent, and a drain region arranged on one side of the channel region and connected to the first connection electrode. The portion of the bottom metal layer may overlap the channel region of the first semiconductor layer that is bent, and the drain region.

In an embodiment, the portion of the bottom metal layer may overlap a second connection point between the first connection electrode and the semiconductor layer of the first oxide-based transistor.

In an embodiment, the bottom metal layer may have a voltage level of a constant voltage.

In an embodiment, the display apparatus may further include a plurality of inorganic insulating layers between the substrate and the first connection electrode. The plurality of inorganic insulating layers may include the at least one insulating layer, and a valley having a first depth may be defined in the plurality of inorganic insulating layers in a thickness direction.

In an embodiment, at least a portion of the valley may be filled with an organic insulating material.

In an embodiment, the display apparatus may further include a second silicon-based transistor including a second semiconductor layer and a second gate electrode. The second semiconductor layer includes a silicon-based semiconductor, and the second gate electrode overlaps the second semiconductor layer, and a first lower scan line electrically connected to the second gate electrode of the second silicon-based transistor. The first lower scan line may have an isolated shape in a plan view and may be electrically connected to a first upper scan line disposed on the first lower scan line and crossing the valley in the plan view.

The display apparatus may further include a storage capacitor including a first capacitor electrode and a second capacitor electrode that overlap each other on the first silicon-based transistor. The at least one insulating layer may include a first inter-insulating layer between the first capacitor electrode and the second capacitor electrode, and a second inter-insulating layer over the first inter-insulating layer. The second capacitor electrode may be disposed under the second inter-insulating layer, and the semiconductor layer of the first oxide-based transistor may be disposed on the second inter-insulating layer.

In an embodiment, the second capacitor electrode may be adjacent to the first connection electrode and may not overlap the first connection electrode in a plan view.

In an embodiment, a distance between one lateral side of the second capacitor electrode and one lateral side of the first connection electrode adjacent to each other may be equal to or greater than about 0.5 micrometer (μm) in the plan view.

In an embodiment of the disclosure, a display apparatus includes a substrate, a bottom metal layer disposed on the substrate, a first silicon-based semiconductor pattern disposed on the bottom metal layer and including a first semiconductor layer, an oxide-based semiconductor pattern apart from the first silicon-based semiconductor pattern, and a first connection electrode electrically connecting a portion of the first silicon-based semiconductor pattern to a portion of the oxide-based semiconductor pattern. A portion of the bottom metal layer overlaps a connection point between the portion of the first silicon-based semiconductor pattern and the first connection electrode.

In an embodiment, the first semiconductor layer of the first silicon-based semiconductor pattern may include a channel region that is bent and an impurity region, the impurity region being arranged on one side of the channel region, and being connected to the first connection electrode. The portion of the bottom metal layer may overlap the channel region of the first semiconductor layer that is bent, and the impurity region.

In an embodiment, the portion of the bottom metal layer may overlap a second connection point between the first connection electrode and the oxide-based semiconductor pattern.

In an embodiment, the bottom metal layer may have a voltage level of a constant voltage.

In an embodiment, the display apparatus may further include a plurality of inorganic insulating layers between the substrate and the first connection electrode. A valley having a first depth may be defined the plurality of inorganic insulating layers in a thickness direction.

In an embodiment, at least a portion of the valley may be filled with an organic insulating material.

In an embodiment, the display apparatus may further include a first lower scan line on the first silicon-based semiconductor pattern. The first silicon-based semiconductor pattern may further include a second semiconductor layer connected to the first semiconductor layer, and the first lower scan line may overlap a portion of the second semiconductor layer.

In an embodiment, the first lower scan line may be electrically connected to a first upper scan line disposed on the first lower scan line and crossing the valley in a plan view.

In an embodiment, the display apparatus may further include a first capacitor overlapping the first semiconductor layer of the first silicon-based semiconductor pattern. The first capacitor may include a first capacitor electrode and a second capacitor electrode on the first capacitor electrode.

In an embodiment, the second capacitor electrode may be adjacent to the first connection electrode and may not overlap the first connection electrode in a plan view.

BRIEF DESCRIPTION OF THE DRAWINGS

The above and other features and advantages of embodiments of the disclosure will be more apparent from the following description taken in conjunction with the accompanying drawings, in which.

DETAILED DESCRIPTION

Figure 1:
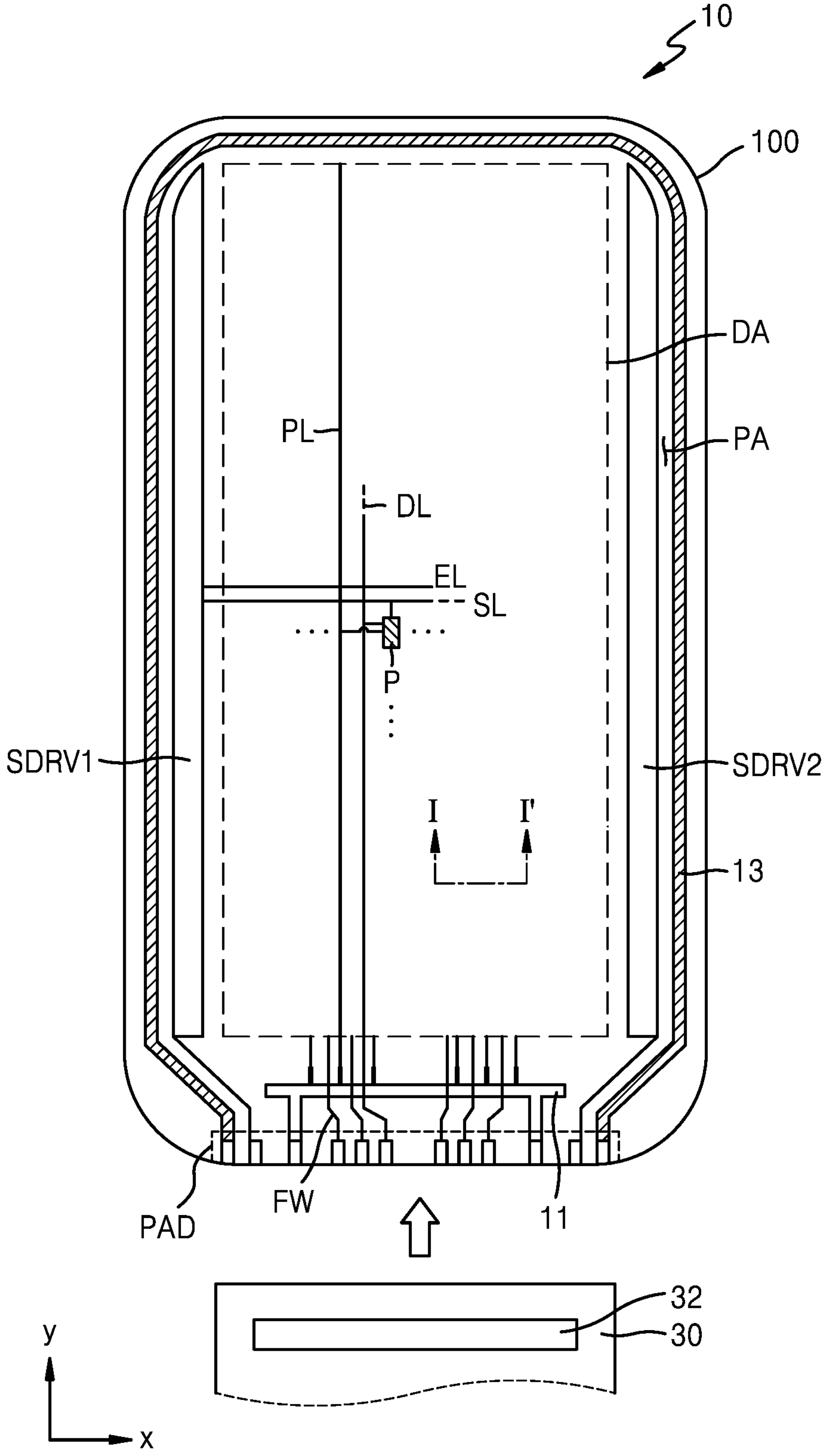
FIG. 1 is a schematic plan view of an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, some embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

As used herein, when various elements such as a layer, a region, a plate, or the like are disposed "on" another element, not only the elements may be disposed "directly on" the other element, but another element may be disposed therebetween. In addition, sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

The X-axis, the Y-axis and the Z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a schematic plan view of an embodiment of a display apparatus 10.

Referring to FIG. 1, various elements constituting the display apparatus 10 are disposed over a substrate 100. The substrate 100 includes a display area DA and a peripheral area PA surrounding the display area DA. The display area DA may be protected from external air, moisture, or the like by being covered by an encapsulation member.

Sub-pixels P are arranged in the display area DA of the substrate 100. The sub-pixels P may each display images by light emitted from a display element, such as a light-emitting diode. Each light-emitting diode may emit, e.g., red, green, or blue light. However, the invention is not limited thereto, and each light-emitting diode may emit various other color light.

Each light-emitting diode may be electrically connected to a sub-pixel circuit. Each sub-pixel circuit may include transistors and a storage capacitor. The sub-pixel circuits may each be electrically connected to peripheral circuits arranged in the peripheral area PA. The peripheral circuits arranged in the peripheral area PA may include a first scan driving circuit SDRV1, a second scan driving circuit SDRV2, a terminal part PAD, a driving voltage supply line 11, and common voltage supply lines 13.

The first scan driving circuit SDRV1 may apply scan signals to each of sub-pixel circuits through a scan line SL, the sub-pixel circuits corresponding to the sub-pixels P. The first scan driving circuit SDRV1 may apply emission control signals to each pixel circuit through an emission control line EL. The second scan driving circuit SDRV2 may be arranged opposite the first scan driving circuit SDRV1 with the display area DA therebetween, and be approximately parallel to the first scan driving circuit SDRV1. Some of the sub-pixel circuits may be electrically connected to the first scan driving circuit SDRV1, and the rest may be electrically connected to the second scan driving circuit SDRV2. In an alternative embodiment, the second scan driving circuit SDRV2 may be omitted.

The terminal part PAD may be arranged on one side of the substrate 100. The terminal part PAD may be exposed and connected to a display circuit board 30 by not being covered by an insulating layer. A display driver 32 may be arranged on the display circuit board 30.

The display driver 32 may generate control signals transferred to the first scan driving circuit SDRV1 and the second scan driving circuit SDRV2. The display driver 32 may generate data signals, and the generated data signals may be transferred to the pixel circuits through fan-out wirings FW and the data lines DL connected to the fan-out wirings FW.

The display driver 32 may supply a driving voltage ELVDD (hereinafter, also referred to as a first power voltage) to the driving voltage supply line 11 and supply a common voltage ELVSS (hereinafter, also referred to as a second power voltage) to the common voltage supply line 13. The driving voltage ELVDD may be applied to the sub-pixel circuits of sub-pixels through a driving voltage line PL connected to the driving voltage supply line 11, and the common voltage ELVSS may be applied to an opposite electrode of the display element through the common voltage supply line 13.

The driving voltage supply line 11 may extend in an x direction below the display area DA. The common voltage supply line 13 may have a loop shape having one open side to partially surround the display area DA.

The display apparatus 10 of FIG. 1 is an apparatus for displaying moving images or still images and may include portable electronic apparatuses, such as mobile phones, smartphones, tablet personal computers, mobile communication terminals, electronic organizers, electronic books, portable multimedia players ("PMP"), navigations, and ultra-mobile personal computers ("UMPC"), or the like. In an alternative embodiment, the display apparatus 10 may be used as a display screen of various products including televisions, notebook computers, monitors, advertisement boards, Internet of things ("IoTs"), or the like. In addition, the display apparatus 10 in an embodiment may be used in wearable devices including smartwatches, watchphones, glasses-type displays, and head-mounted displays ("HMD"). In addition, the display apparatus 10 in an embodiment may be used as instrument panels for automobiles, center fascias for automobiles, or center information displays ("CID") arranged on a dashboard, room mirror displays that replace side mirrors of automobiles, and displays arranged on the backside of front seats as entertainment for back seats of automobiles.

Figure 2:
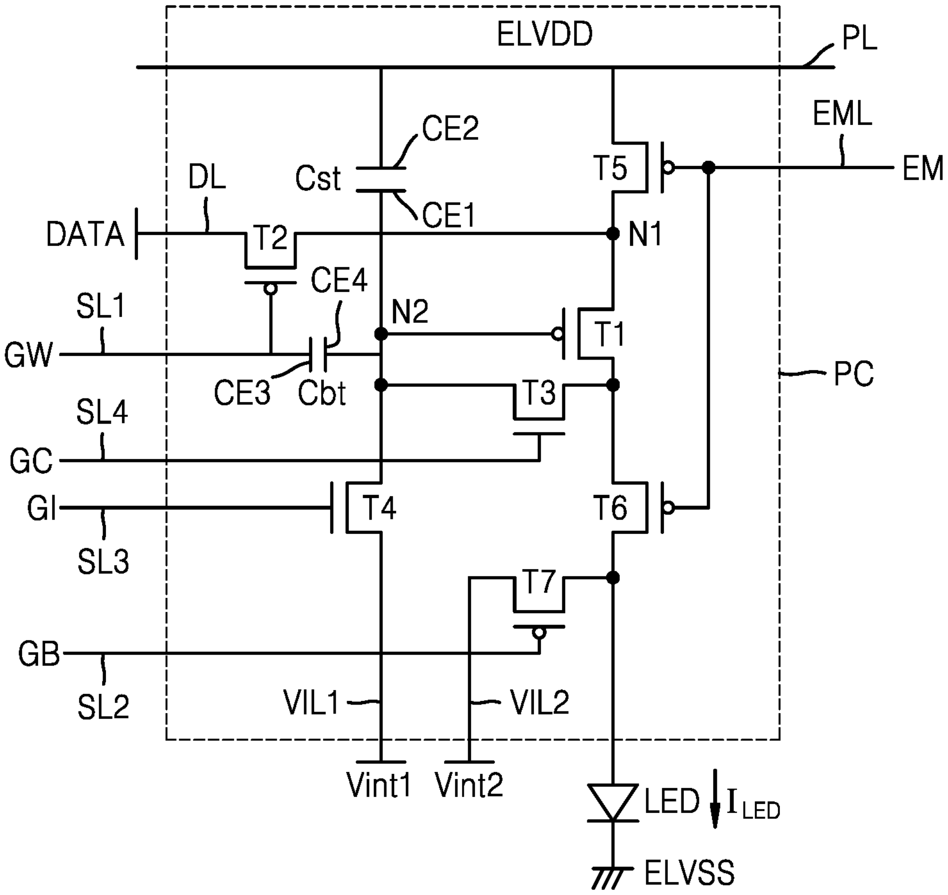
FIG. 2 is a schematic equivalent circuit diagram of an embodiment of a light-emitting diode corresponding to one of sub-pixels of a display apparatus and a sub-pixel circuit connected thereto.

FIG. 2 is a schematic equivalent circuit diagram of an embodiment of a light-emitting diode LED corresponding to one of sub-pixels of a display apparatus and a sub-pixel circuit connected thereto.

Referring to FIG. 2, the light-emitting diode LED may be electrically connected to a sub-pixel circuit PC. The sub-pixel circuit PC includes a plurality of transistors and a storage capacitor.

The light-emitting diode LED may include an organic light-emitting diode including an organic material as an emission material. In another embodiment, the light-emitting diode LED may be an inorganic light-emitting diode including an inorganic material. The inorganic light-emitting diode may include a PN-junction diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers. In an embodiment, the light-emitting diode LED may be a quantum-dot light-emitting diode. As described above, an emission layer of the light-emitting diode LED may include an organic material, an inorganic material, quantum dots, an organic material and quantum dots, or inorganic material and quantum dots. Hereinafter, for convenience of description, the case where the light-emitting diode LED includes an organic light-emitting diode is described.

The sub-pixel circuit PC may include a first transistor T1, a second transistor T2, a third transistor T3, a fourth transistor T4, a fifth transistor T5, a sixth transistor T6, and a seventh transistor T7.

The sub-pixel circuit PC is connected to signal lines, first and second initialization voltage lines VIL1 and VIL2, and the driving voltage line PL. The signal lines may include a data line DL, a first scan line SL1, a second scan line SL2, a third scan line SL3, a fourth scan line SL4, and an emission control line EML. In another embodiment, at least one of the signal lines, for example the first and second initialization voltage lines VIL1 and VIL2, and/or the driving voltage line PL may be shared by adjacent sub-pixel circuits.

The driving voltage line PL may transfer the first power voltage ELVDD to the first transistor T1. The first initialization voltage line VIL1 may transfer a first initialization voltage Vint1 to the sub-pixel circuit PC. The first initialization voltage Vint1 initializes the first transistor T1. The second initialization voltage line VIL2 may transfer a second initialization voltage Vint2 to the sub-pixel circuit PC. The second initialization voltage Vint2 initializes the first transistor T1.

The first transistor T1 is connected to the driving voltage line PL through the fifth transistor T5, and electrically connected to the light-emitting diode LED through the sixth transistor T6. The first transistor T1 serves as a driving transistor, receives a data signal DATA according to a switching operation of the second transistor T2, and supplies a driving current $I_{LED}$ to the light-emitting diode LED.

The second transistor T2 serves as a switching transistor, connected to the first scan line SL1 and the data line DL, and connected to the driving voltage line PL through the fifth transistor T5. The second transistor T2 is turned on according to a first scan signal GW transferred through the first scan line SL1, and performs a switching operation of transferring a data signal DATA to a node N1, the data signal DATA being transferred through the data line DL.

The third transistor T3 serves as a compensation transistor, is connected to the fourth scan line SL4, and connected to the light-emitting diode LED through the sixth transistor T6. The third transistor T3 may be turned on according to a fourth scan signal GC to diode-connect the first transistor T1. The fourth scan signal GC is transferred through the fourth scan line SL4.

The fourth transistor T4 serves as a first initialization transistor, is connected to the third scan line SL3, which is a previous scan line, and the first initialization voltage line VIL1, is turned on according to a third scan signal GI, which is a previous scan signal transferred through the third scan line SL3, and transfers the first initialization voltage Vint1 from the first initialization voltage line VIL1 to the gate electrode of the first transistor T1, thereby initializing the voltage of the gate electrode of the first transistor T1.

The fifth transistor T5 may be an operation control transistor, and the sixth transistor T6 may be an emission control transistor. The fifth transistor T5 and the sixth transistor T6 may be connected to an emission control line EML, simultaneously turned on according to an emission control signal EM transferred through the emission control line EML, and may define a current path such that the driving current $I_{LED}$ flows in a direction from the driving voltage line PL to the light-emitting diode LED.

The seventh transistor T7 serves as a second initialization transistor and may be electrically connected to the second scan line SL2, the second initialization voltage line VIL2, and the sixth transistor T6. The seventh transistor T7 is turned on according to a second scan signal GB transferred through the second scan line SL2, and transfers the second initialization voltage Vint2 from the second initialization voltage line VIL2 to the light-emitting diode LED, thereby initializing the light-emitting diode LED. In an alternative embodiment, the seventh transistor T7 may be omitted. A second scan signal GB of the second scan line SL2 may be a scan signal of a first scan line arranged on a previous row of the relevant sub-pixel circuit PC.

A first capacitor Cst may include a first capacitor electrode CE1 and a second capacitor electrode CE2. The first capacitor electrode CE1 is connected to the gate electrode of the first transistor T1, and the second capacitor electrode CE2 is connected to the driving voltage line PL. The first capacitor Cst serves as a storage capacitor, and may maintain a voltage applied to the gate electrode of the first transistor T1 by storing and maintaining a voltage corresponding to a difference between voltages of two opposite ends of the gate electrode of the first transistor T1 and the driving voltage line PL.

A second capacitor Cbt may include a third capacitor electrode CE3 and a fourth capacitor electrode CE4. The third capacitor electrode CE3 is connected to the first scan line SL1 and the gate electrode of the second transistor T2. The fourth capacitor electrode CE4 is connected to the gate electrode of the first transistor T1 and the first capacitor electrode CE1 of the first capacitor Cst. The second capacitor Cbt serves as a boosting capacitor. When a first scan signal GW of the first scan line SL1 is a voltage that turns off the second transistor T2, the second capacitor Cbt may reduce a voltage (a black voltage) that displays black by increasing the voltage of a node N2.

The light-emitting diode LED may include a first electrode (e.g., an anode), a second electrode (e.g., a cathode) facing each other, and an emission layer between the first electrode and the second electrode. The second electrode may receive the second power voltage ELVSS. The emission layer of the light-emitting diode LED may receive the driving current $I_{LED}$ from the first transistor T1 and emit light.

A predetermined operation of the sub-pixel circuit PC in an embodiment is described below.

When a third scan signal GI is supplied through the third scan line SL3 during the first initialization period, the fourth transistor T4 is turned on according to the third scan signal GI, and the first transistor T1 is initialized by the first initialization voltage Vint1 supplied from the first initialization voltage line VIL1.

When a first scan signal GW and a fourth scan signal GC are supplied through the first scan line SL1 and the fourth scan line SL4 during a data programming period, the second transistor T2 and the third transistor T3 are turned on according to the first scan signal GW and the fourth scan signal GC. In this case, the first transistor T1 is diode-connected and forward-biased by the third transistor T3 that is turned on. Then, a voltage, in which a threshold voltage of the first transistor T1 is compensated for from a data signal DATA supplied from the data line DL, is applied to the gate electrode of the first transistor T1. The first power voltage ELVDD and the compensation voltage are applied to two opposite ends of the first capacitor Cst, and charge corresponding to the voltage difference between the two opposite ends is stored in the first capacitor Cst.

During an emission period, the fifth transistor T5 and the sixth transistor T6 are turned on according to an emission control signal EM supplied from the emission control line EML. The driving current $I_{LED}$ corresponding to the voltage difference between the gate electrode of the first transistor T1 and the first power voltage ELVDD occurs, and the driving current $I_{LED}$ is supplied to the light-emitting diode LED through the sixth transistor T6.

When a second scan signal GB is supplied through the second scan line SL2 during the second initialization period, the seventh transistor T7 is turned on according to the second scan signal GB, and the light-emitting diode LED is initialized by the second initialization voltage Vint2 supplied from the second initialization voltage line VIL2.

At least one of the first to seventh transistors T1, T2, T3, T4, T5, T6, and T7 of the sub-pixel circuit PC may include a semiconductor layer including an oxide, and the rest may include a semiconductor layer including silicon. It is shown in FIG. 2 that the third transistor T3 and the fourth transistor T4 are implemented as n-channel metal oxide semiconductor field-effect transistors ("NMOSs"), and the first transistor T1, the second transistor T2, the fifth transistor T5, the sixth transistor T6, and the seventh transistor T7 are silicon-based transistors and implemented as p-channel metal oxide semiconductor field-effect transistors ("PMOSs"). In another embodiment, the third transistor T3 may be implemented as an NMOS, and the first transistor T1, the second transistor T2, the fourth transistor T4, the fifth transistor T5, the sixth transistor T6, and the seventh transistor T7 may be implemented as PMOSs.

Specifically, the first transistor T1 directly influencing the brightness of the display apparatus may include a semiconductor layer including polycrystalline silicon having high reliability, and thus, a high-resolution display apparatus may be implemented through this configuration.

Because an oxide semiconductor has high carrier mobility and a low leakage current, a voltage drop is not large even when a driving time is long. That is, because a color change of an image according to a voltage drop is not large even while the display apparatus is driven in low frequencies, the display apparatus may be driven in low frequencies. Because an oxide semiconductor has an advantage of a low leakage current as described above, an oxide semiconductor is employed in at least one of the third transistor T3 connected to the gate electrode of the first transistor T1 or the fourth transistor T4, a leakage current that may flow to the gate electrode of the first transistor T1 may be prevented, and simultaneously, power consumption may be reduced.

The pixel circuit PC is not limited to the number of thin-film transistors, the number of storage capacitors, and the circuit design described with reference to FIG. 2, and the number of thin-film transistors, the number of storage capacitors, and the circuit design may be variously changed.

Figure 3:
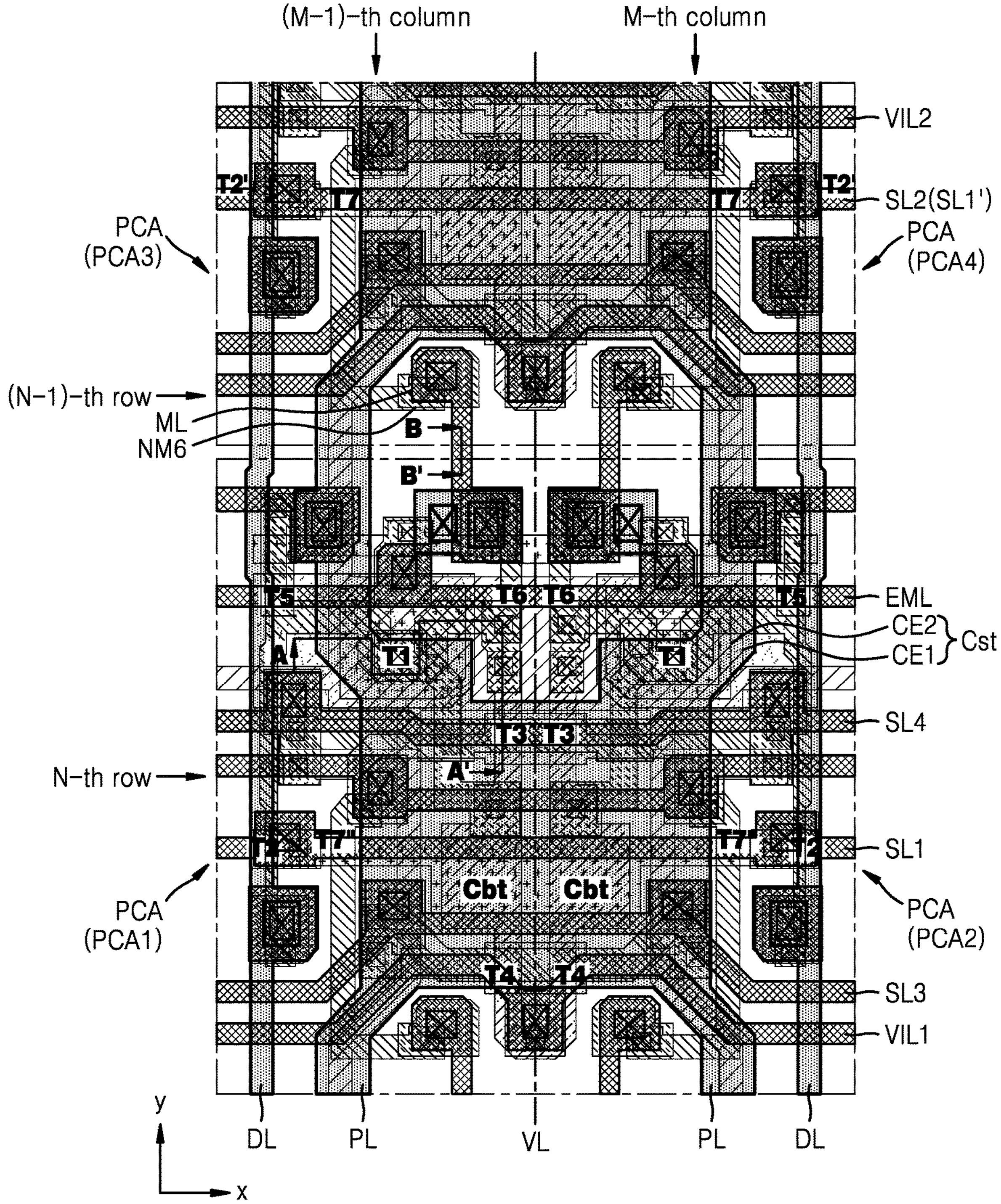
FIG. 3 is a schematic plan view of an embodiment of sub-pixel circuit areas arranged in the display area of the display apparatus.

FIG. 3 is a schematic plan view of an embodiment of sub-pixel circuit areas arranged in the display area DA of the display apparatus 10. The sub-pixel circuits described above with reference to FIG. 2 are arranged in the display area DA of the display apparatus 10 described with reference to FIG. 1. With regard to this, FIG. 3 shows sub-pixel circuits arranged in the display area DA. The sub-pixel circuits are arranged in sub-pixel circuit areas PCA forming rows and columns. With regard to this, FIG. 3 shows sub-pixel circuit areas PCA arranged on an N-th row, an (N−1)-th row, an (M−1)-th column, and an M-th column. FIG. 3 shows portions of two adjacent sub-pixel circuit areas PCA arranged on the N-th row, and two adjacent sub-pixel circuit areas PCA arranged on the (N−1)-th row.

The first scan line SL1, the second scan line SL2, the third scan line SL3, the fourth scan line SL4, the emission control line EML, and the first and second initialization voltage lines VIL1 and VIL2 may each extend in a first direction (an x direction) and be apart from each other. The data line DL and the driving voltage line PL may each extend in a second direction (a y direction) and be apart from each other. In an embodiment, it is shown in FIG. 3 that the driving voltage line PL is shared by an (M−1)-th column and an M-th column. In other words, the driving voltage line PL arranged on the (M−1)-th column may be formed or provided (e.g., extended) as one body with the driving voltage line PL arranged on the M-th column. In other words, the driving voltage line PL arranged on the (M−1)-th column may be separated and apart from the driving voltage line PL arranged on the M-th column.

A plurality of transistors and a plurality of capacitor electrodes may be arranged in each sub-pixel circuit area PCA. With regard to this, it is shown in FIG. 3 that seven transistors and two capacitors are arranged in each sub-pixel circuit area PCA.

Referring to one sub-pixel circuit area PCA (hereinafter, also referred to as a first sub-pixel circuit area PCA1) arranged on the N-th row and (M−1)-th column, the first to sixth transistors, T1, T2, T3, T4, T5, and T6, the first capacitor Cst, and the second capacitor Cbt that correspond to the sub-pixel circuit PC (refer to FIG. 2) described above with reference to FIG. 2 may be arranged in the first sub-pixel circuit area PCA1.

The seventh transistor T7 electrically connected to the first to sixth transistors, T1, T2, T3, T4, T5, and T6, the first capacitor Cst, and the second capacitor Cbt arranged in the first sub-pixel circuit area PCA1, may be disposed on the (N−1)-th row. In other words, the first to sixth transistors, T1, T2, T3, T4, T5, and T6, the first capacitor Cst, and the second capacitor Cbt arranged in the first sub-pixel circuit area PCA1 may be electrically connected to the seventh transistor T7 arranged in a sub-pixel circuit area (hereinafter, also referred to as a third sub-pixel circuit area PCA3) on the (N−1)-th row and (M−1)-th column. In an embodiment, the seventh transistor T7 arranged in the third sub-pixel circuit area PCA3 on the (N−1)-th row may be electrically connected to the sixth transistor T6 arranged in the first sub-pixel circuit area PCA1 through a sixth connection electrode NM6 and a connection line ML. The first to sixth transistors, T1, T2, T3, T4, T5, and T6, the first capacitor Cst, and the second capacitor Cbt arranged in the first sub-pixel circuit area PCA1, and the seventh transistor T7 arranged in the third sub-pixel circuit area PCA3 may operate to turn on/off the same light-emitting diode LED (refer to FIG. 2). The seventh transistor T7 arranged in the first sub-pixel circuit area PCA1 on the N-th row may be electrically connected to the first to sixth transistors, T1, T2, T3, T4, T5, and T6 arranged on the (N+1)-th row. The seventh transistor T7 arranged in the third sub-pixel circuit area PCA3 may receive a second scan signal and a second initialization voltage through the second scan line SL2 and the second initialization voltage line VIL2, respectively, passing across the third sub-pixel circuit area PCA3. The second scan line SL2 may correspond to a first scan line SL1' which provides a first scan signal to a second transistor T2' arranged in the third sub-pixel circuit area PCA3.

Each of the first transistor T1, the second transistor T2, the fifth transistor T5, the sixth transistor T6, and the seventh transistor T7 may be a transistor (hereinafter, also referred to as a silicon-based transistor) including a silicon-based semiconductor layer and be formed or disposed along the silicon semiconductor pattern. Each of the third transistor T3 and the fourth transistor T4 may be a transistor including an oxide-based semiconductor layer (hereinafter, also referred to as an oxide-based transistor and be formed or disposed along the oxide semiconductor pattern.

A sub-pixel circuit area PCA (hereinafter, also referred to as a second sub-pixel circuit area PCA2 arranged on the N-th row and M-th column may include the same structure as that of the first sub-pixel circuit area PCA1. In an embodiment, it is shown in FIG. 3 that the first sub-pixel circuit area PCA1 and the second sub-pixel circuit area PCA2 on the same row have a symmetrical structure with respect to a virtual line VL (a virtual line in the y direction) therebetween. In another embodiment, the first sub-pixel circuit area PCA1 and the second sub-pixel circuit area PCA2 may be asymmetrical with respect to the virtual line VL.

The first to sixth transistors, T1, T2, T3, T4, T5, and T6, the first capacitor Cst, and the second capacitor Cbt arranged in the second sub-pixel circuit area PCA2 may be electrically connected to the seventh transistor T7 arranged in a sub-pixel circuit area (hereinafter, also referred to as a fourth sub-pixel circuit area PCA4 on the (N−1)-th row and M-th column. In other words, the first to sixth transistors, T1, T2, T3, T4, T5, and T6, the first capacitor Cst, and the second capacitor Cbt arranged in the second sub-pixel circuit area PCA2, and the seventh transistor T7 arranged in the fourth sub-pixel circuit area PCA4 may constitute the sub-pixel circuit PC (refer to FIG. 2) which drives the same light-emitting diode LED (refer to FIG. 2).

A structure of each of the third sub-pixel circuit area PCA3 and the fourth sub-pixel circuit area PCA4 is the same as the structure of each of the first sub-pixel circuit area PCA1 and the second sub-pixel circuit area PCA2.

The first to sixth transistors, T1, T2, T3, T4, T5, and T6, the first capacitor Cst, and the second capacitor Cbt arranged in each sub-pixel circuit area PCA may have an electric connection structure described above with reference to FIG. 2, and a predetermined structure thereof is described below with reference to FIGS. 5 to 14.

Figure 4:
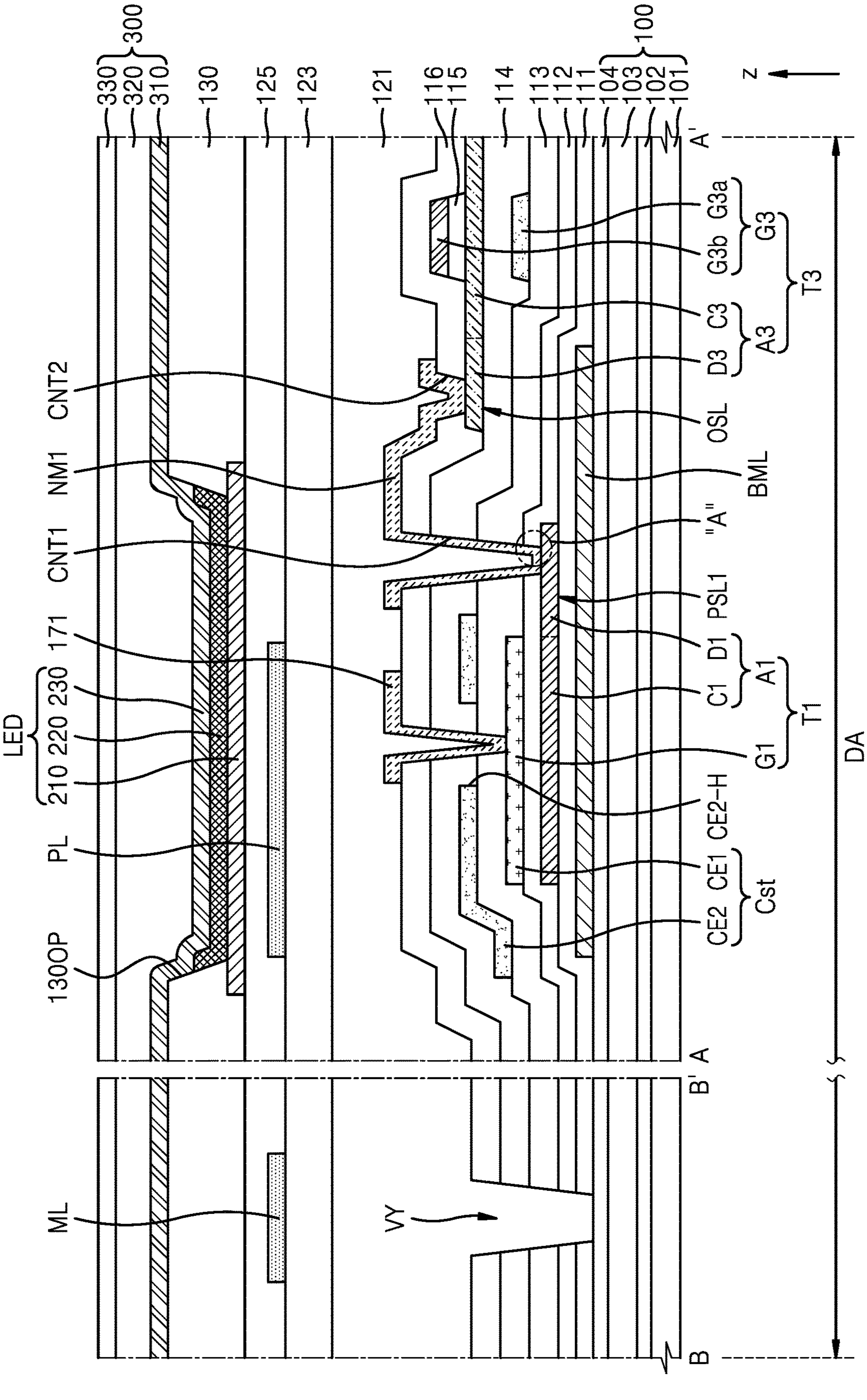
FIG. 4 is a cross-sectional view of an embodiment of a display apparatus.

FIG. 4 is a cross-sectional view of an embodiment of the display apparatus. The first transistor and the third transistor shown in FIG. 4 correspond to a cross-section of the sub-pixel circuit area, taken along line IV-IV' of FIG. 3. Hereinafter, description is made according to a stacking order with reference to FIG. 4.

Referring to a cross-section of the display apparatus, taken along line A-A' of FIG. 4, the substrate 100 may include a glass material, a ceramic material, metal, plastic, or a flexible or bendable material. In the case where the substrate 100 is flexible or bendable, the substrate 100 may include a polymer resin including at least one of polyethersulphone ("PES"), polyacrylate, polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP").

The substrate 100 may have a single-layered structure or a multi-layered structure of the above materials, and may further include an inorganic layer in the case of the multi-layered structure. In an embodiment, the substrate 100 may include a first organic base layer 101, a first inorganic barrier layer 102, a second organic base layer 103, and a second inorganic barrier layer 104. The first organic base layer 101 and the second organic base layer 103 may each include a polymer resin. The first inorganic barrier layer 102 and the second inorganic barrier layer 104 serve as barrier layers preventing the penetration of external foreign materials, and may include a single layer or a multi-layer including an inorganic insulating material, such as silicon nitride and/or silicon oxide.

A bottom metal layer BML may be disposed on the substrate 100. The bottom metal layer BML may include at least one material among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). In an embodiment, the bottom metal layer BML may have a molybdenum-single layer structure, a double-layered structure in which a molybdenum layer and a titanium layer are stacked, or a triple-layered structure in which a titanium layer, an aluminum layer, and a titanium layer are stacked.

A buffer layer 111 may be disposed on the bottom metal layer BML. The buffer layer 111 may include an inorganic insulating layer including an inorganic insulating material, such as silicon nitride and/or silicon oxide, and include a single layer or a multi-layered structure including the above materials.

A semiconductor layer of silicon-based transistors may be disposed on the buffer layer 111. With regard to this, FIG. 4 shows a first semiconductor layer A1 of the first transistor T1 corresponding to a portion of a first silicon semiconductor pattern PSL1. The first semiconductor layer A1 may include a first channel region C1, and impurity regions arranged on two opposite sides of the first channel region C1 and doped with impurities. With regard to this, FIG. 4 shows a second region D1, which is one of the impurity regions arranged on one side of the first channel region C1.

A first gate insulating layer 112 may be disposed on the first silicon semiconductor pattern PSL1. The first gate insulating layer 112 may be an inorganic insulating layer including an inorganic insulating material, such as silicon oxide, silicon nitride and/or silicon oxynitride, and include a single layer or a multi-layered structure including the above materials.

A first gate electrode G1 and the first capacitor electrode CE1 may be disposed on the first gate insulating layer 112. It is shown in FIG. 4 that the first gate electrode G1 is formed or provided as one body with the first capacitor electrode CE1. In other words, the first gate electrode G1 may perform a function of the first capacitor electrode CE1, or the first capacitor electrode CE1 may perform a function of the first gate electrode G1.

The first gate electrode G1 and/or the first capacitor electrode CE1 may include aluminum (Al), platinum (Pt), palladium (Pd), silver (Ag), magnesium (Mg), gold (Au), Nickel (Ni), neodymium (Nd), iridium (Ir), chrome (Cr), lithium (Li), calcium (Ca), molybdenum (Mo), titanium (Ti), tungsten (W), and/or copper (Cu), and include a single layer or a multi-layer including the above materials.

A first inter-insulating layer 113 may be disposed on the first gate electrode G1 and/or the first capacitor electrode CE1. The first inter-insulating layer 113 may be an inorganic insulating layer including an inorganic insulating material, such as silicon oxide, silicon nitride and/or silicon oxynitride, and include a single layer or a multi-layered structure including the above material.

The second capacitor electrode CE2 may be disposed on the first inter-insulating layer 113. The second capacitor electrode CE2 may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu), and include a single layer or a multi-layer including the above materials. The second capacitor electrode CE2 may overlap the first gate electrode G1 and/or the first capacitor electrode CE1. A hole CE2-H for connection between a node connection electrode 171 and the first gate electrode G1 may be defined in the second capacitor electrode CE2. The node connection electrode 171 is for electric connection between the first gate electrode G1 of the first transistor T1 and the third transistor T3. The hole CE2-H may overlap a portion of the first gate electrode G1.

A second inter-insulating layer 114 may be disposed on the second capacitor electrode CE2. The second inter-insulating layer 114 may include an inorganic insulating layer including an inorganic insulating material, such as silicon oxide, silicon nitride and/or silicon oxynitride, and include a single layer or a multi-layered structure including the above material.

Oxide semiconductor layers may be disposed on the second inter-insulating layer 114. With regard to this, FIG. 4 shows a third semiconductor layer A3 of the third transistor T3 corresponding to a portion of an oxide semiconductor pattern OSL. The third semiconductor layer A3 may include a third channel region C3, and conductive regions arranged on two opposite sides of the third channel region C3. With regard to this, FIG. 4 shows a second region D3, which is one of the conductive regions arranged on one side of the third channel region C3.

A third gate electrode G3 may be disposed below and/or over the third semiconductor layer A3. In an embodiment, it is shown in FIG. 4 that the third gate electrode G3 includes a third lower gate electrode G3*a* and a third upper gate electrode G3*b*. The third lower gate electrode G3*a* is disposed below the third semiconductor layer A3, and the third upper gate electrode G3*b* is disposed over the third semiconductor layer A3. In another embodiment, one of the third lower gate electrode G3*a* and the third upper gate electrode G3*b* may be omitted.

The third lower gate electrode G3*a* may include the same material as that of the second capacitor electrode CE2, and be arranged in the same layer (e.g., the first inter-insulating layer 113). The third upper gate electrode G3*b* may be disposed over the third semiconductor layer A3 with the second gate insulating layer 115 therebetween. The third upper gate electrode G3*b* may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu), and include a single layer or a multi-layer including the above materials.

Though it is shown in FIG. 4 that the second gate insulating layer 115 is disposed only between the third upper gate electrode G3*b* and the third semiconductor layer A3, the embodiment is not limited thereto. Like another insulating layer for example, the first gate insulating layer 112, the second gate insulating layer 115 may cover an entirety of the substrate 100. The second gate insulating layer 115 may include an inorganic insulating layer including an inorganic insulating material, such as silicon oxide, silicon nitride and/or silicon oxynitride, and include a single layer or a multi-layered structure including the above material.

A third inter-insulating layer 116 may be disposed on the third upper gate electrode G3*b*. The third inter-insulating layer 116 may include an inorganic insulating layer including an inorganic insulating material, such as silicon oxide, silicon nitride and/or silicon oxynitride, and include a single layer or a multi-layered structure including the above material.

The node connection electrode 171 and the first connection electrode NM1 may be disposed on the third inter-insulating layer 116. The node connection electrode 171 and the first connection electrode NM1 may include aluminum (Al), platinum (Pt), palladium (Pd), silver (Ag), magnesium (Mg), gold (Au), Nickel (Ni), neodymium (Nd), iridium (Ir), chrome (Cr), lithium (Li), calcium (Ca), molybdenum (Mo), titanium (Ti), tungsten (W), and/or copper (Cu), and include a single layer or a multi-layer including the above materials.

The first connection electrode NM1 may electrically connect the first semiconductor layer A1 to the third semiconductor layer A3. The first connection electrode NM1 may be connected to a portion (e.g., the second region D1 of FIG. 4) of the first semiconductor layer A1 through a first contact hole CNT1, and connected to a portion (e.g., the second region D3 of FIG. 4) of the third semiconductor layer A3 through the second contact hole CNT2. The first contact hole CNT1 may pass through inorganic insulating layers, e.g., the first gate insulating layer 112, the first inter-insulating layer 113, the second inter-insulating layer 114, and the third inter-insulating layer 116 disposed between the first semiconductor layer A1 and the first connection electrode NM1. The second contact hole CNT2 may pass through the third inter-insulating layer 116 disposed between the third semiconductor layer A3 and the first connection electrode NM1.

The depth of the first contact hole CNT1 is greater than the depth of the second contact hole CNT2 in the z direction. In the case where a touch input, such as a finger or a stylus pen, is applied, or unintended pressure is applied to the display area DA, fine cracks may occur due to bending deformation and vertical pressing concentrated on structurally weak portions of elements of the sub-pixel circuit arranged in the display area DA, and tension in a plane direction (e.g., an xy direction). Fine cracks may occur in relatively and structurally weak portions. In an embodiment, in the first connection electrode NM1 formed or disposed along the inner surface of the first contact hole CNT1, fine cracks may occur near a region "A", which is a lower portion of the first contact hole CNT1. In the case where the fine cracks propagate to the surroundings through the inorganic insulating layers (e.g., the buffer layer 111, the first gate insulating layer 112, the first inter-insulating layer 113, the second inter-insulating layer 114, or the like), defects, such as the occurrence of bright and dark spots, may occur near the first transistor T1. Here, the bright and dark spots may denote that light having chroma (e.g., red, green, or blue light) may be locally emitted even though the display apparatus is driven to display a black image in the display area. In contrast, in an embodiment, because the bottom metal layer BML below the first semiconductor layer A1 of the first transistor T1 overlaps a first connection point (e.g., the first contact hole CNT1) between the first connection electrode NM1 and the first semiconductor layer A1, the above issue may be prevented or reduced.

A second connection point (e.g., the second contact hole CNT2) between the first connection electrode NM1 and the third semiconductor layer A3 may be adjacent to the first contact hole CNT1. In an embodiment, the bottom metal layer BML may overlap both the first connection point between the first connection electrode NM1 and the first semiconductor layer A1, and the second connection point between the first connection electrode NM1 and the third semiconductor layer A3.

The bottom metal layer BML may have a voltage level of a constant voltage. In an embodiment, the bottom metal layer BML may be electrically connected to the driving voltage supply line 11 (refer to FIG. 1) described with reference to FIG. 1 and may have the same voltage level (e.g., the driving voltage ELVDD (refer to FIG. 2)) as that of the driving voltage supply line 11 (refer to FIG. 1). The bottom metal layer BML may prevent or reduce the occurrence of an afterimage due to (−) charges by preventing the (−) charges from gathering at the lower portion of the first semiconductor layer A1 of the first transistor T1.

A first organic insulating layer 121 may be formed or disposed on the first connection electrode NM1 and the node connection electrode 171. The first organic insulating layer 121 may include an organic material, such as acryl, benzocyclobutene ("BCB"), polyimide, or hexamethyldisiloxane ("HMDSO").

A second organic insulating layer 123 may be disposed on the first organic insulating layer 121, and the driving voltage line PL may be disposed on the second organic insulating layer 123. A third organic insulating layer 125 may be disposed on the driving voltage line PL. The driving voltage line PL may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), and/or tungsten (W). In an embodiment, the driving voltage line PL may have a triple-layered structure of a titanium layer, an aluminum layer, and a titanium layer.

The second organic insulating layer 123 and the second organic insulating layer 125 may each include an organic insulating material, such as benzocyclobutene ("BCB"), polyimide, or hexamethyldisiloxane ("HMDSO").

The light-emitting diode LED may be disposed on the third organic insulating layer 125. The light-emitting diode LED may include a first electrode 210, an emission layer 220, and a second electrode 230 on the third organic insulating layer 125. The emission layer 220 may include a low-molecular weight organic material or a polymer organic material. At least one of a hole injection layer ("HIL"), a hole transport layer ("HTL"), an electron transport layer ("ETL"), and an electron injection layer ("EIL") may be further disposed between the first electrode 210 and the second electrode 230.

The edges of the first electrode 210 may be covered by a bank layer 130, and the inner portion of the first electrode 210 may overlap the emission layer 220 through an opening 1300P of the bank layer 130. While the first electrode 210 may be formed or provided for each light-emitting diode LED, the second electrode 230 may correspond to a plurality of light-emitting diodes LED. In other words, the plurality of light-emitting diodes LED may share the second electrode 230. A stack structure of the first electrode 210, the emission layer 220, and a portion of the second electrode 230 may correspond to the light-emitting diode LED.

An encapsulation layer 300 may be disposed on the light-emitting diode LED. The encapsulation layer 300 may include at least one inorganic encapsulation layer and at least one organic encapsulation layer. It is shown in FIG. 4 that the encapsulation layer 300 includes a first inorganic encapsulation layer 310, an organic encapsulation layer 320, and a second inorganic encapsulation layer 330 in an embodiment. The first inorganic encapsulation layer 310 and the second inorganic encapsulation layer 330 may each include silicon oxide, silicon nitride, and/or silicon oxynitride. The organic encapsulation layer 320 may include an organic insulating material.

Referring to the cross-section of the display apparatus, taken along line B-B' of FIGS. 3 and 4, a valley VY may be defined in the inorganic insulating layers disposed on the substrate 100 between adjacent sub-pixel circuit areas PCA. In an embodiment, as shown in FIG. 4, the valley VY may pass through at least some of the inorganic insulating layers on the substrate 100, e.g., a portion of the buffer layer 111, the first gate insulating layer 112, the first inter-insulating layer 113, the second inter-insulating layer 114, and the third inter-insulating layer 116. A first depth of the valley VY may be equal to or less than a sum of the thicknesses of the buffer layer 111, the first gate insulating layer 112, the first inter-insulating layer 113, the second inter-insulating layer 114, and the third inter-insulating layer 116.

At least a portion of the valley VY may be filled with an organic insulating material. In an embodiment, as shown in FIG. 4, there may be a portion of the first organic insulating layer 121 inside the valley VY. The first organic insulating layer 121 is disponed on the first to third transistors T1, T2, and T3. Through the valley structure, a display apparatus that is flexible and robust against external impacts (impacts occurring during an event of applying a preset pressure to a local area, such as a finger or a stylus pen) may be provided. Fine cracks occurring between the substrate 100 and the light-emitting diode LED may occur in a structurally weak portion as described above. Here, the structurally weak portion may denote a portion in which the density of a layer (or an electrode) formed or provided is deteriorated due to a structural shape, such as a region "A" of FIG. 4, or by a deposition process. The valley VY may suppress the occurrence of fine cracks and prevent fine cracks from propagating in a horizontal direction (a direction parallel to the upper surface of the substrate 100).

Though it is shown in FIG. 4 that the organic insulating material that fills at least a portion of the valley VY is a portion of the first organic insulating layer 121, the embodiment is not limited thereto.

Figure 5:
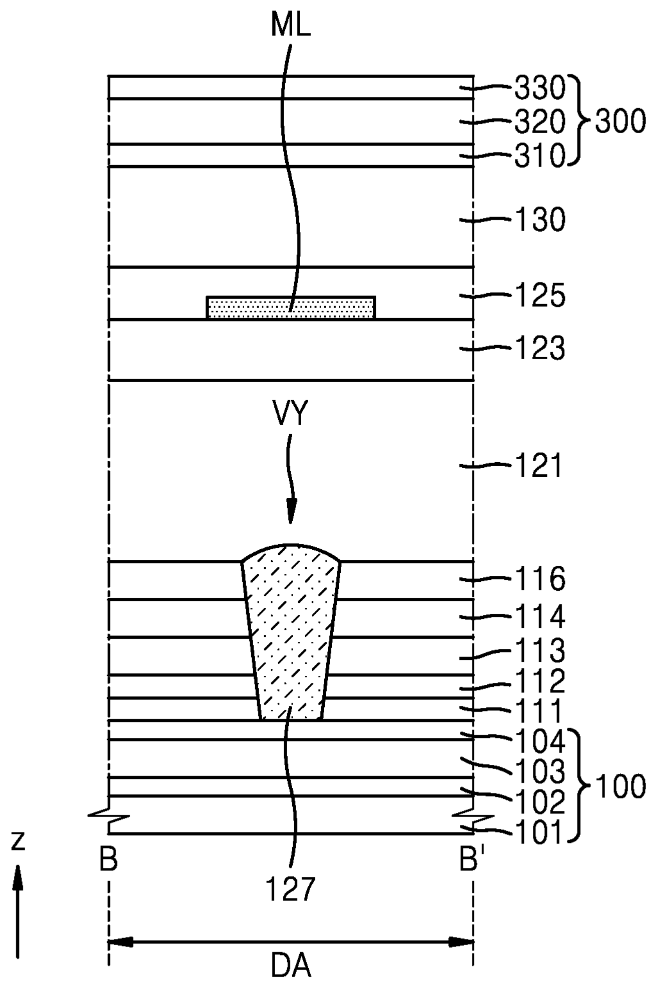
FIG. 5 is a view of a modified embodiment of the display apparatus, taken along line B-B' of FIG. 4.

FIG. 5 is a view of a modified embodiment of the display apparatus, taken along line B-B' of FIG. 4.

In another embodiment, the organic insulating material that fills at least a portion of the valley VY may be an organic insulating material that does not overlap the transistors of the sub-pixel circuit. In an embodiment, as shown in FIG. 5, the organic insulating material 127 that fills at least a portion of the valley VY may be only inside the valley VY in the display area DA.

Figure 10:
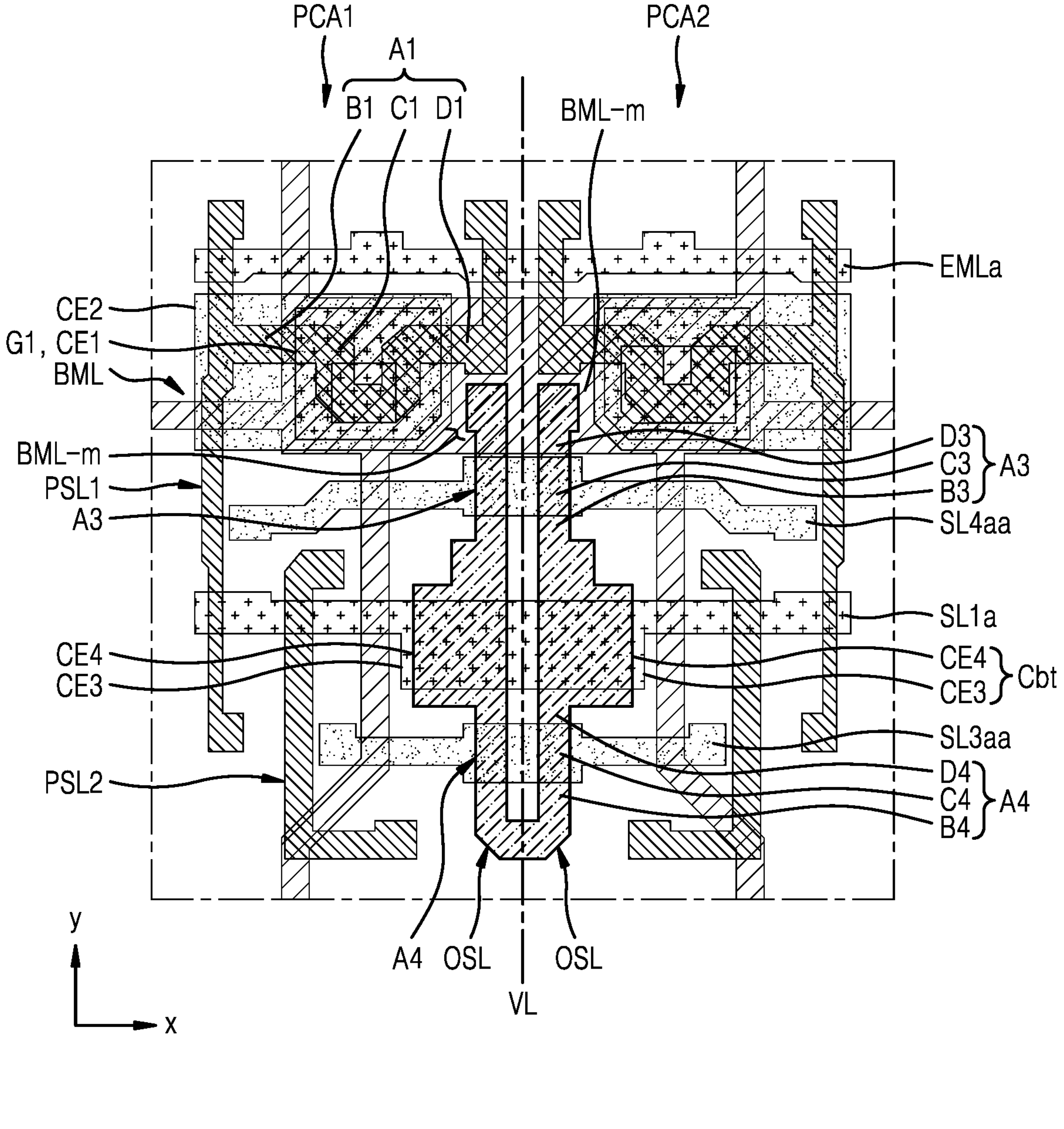
Figure 11:
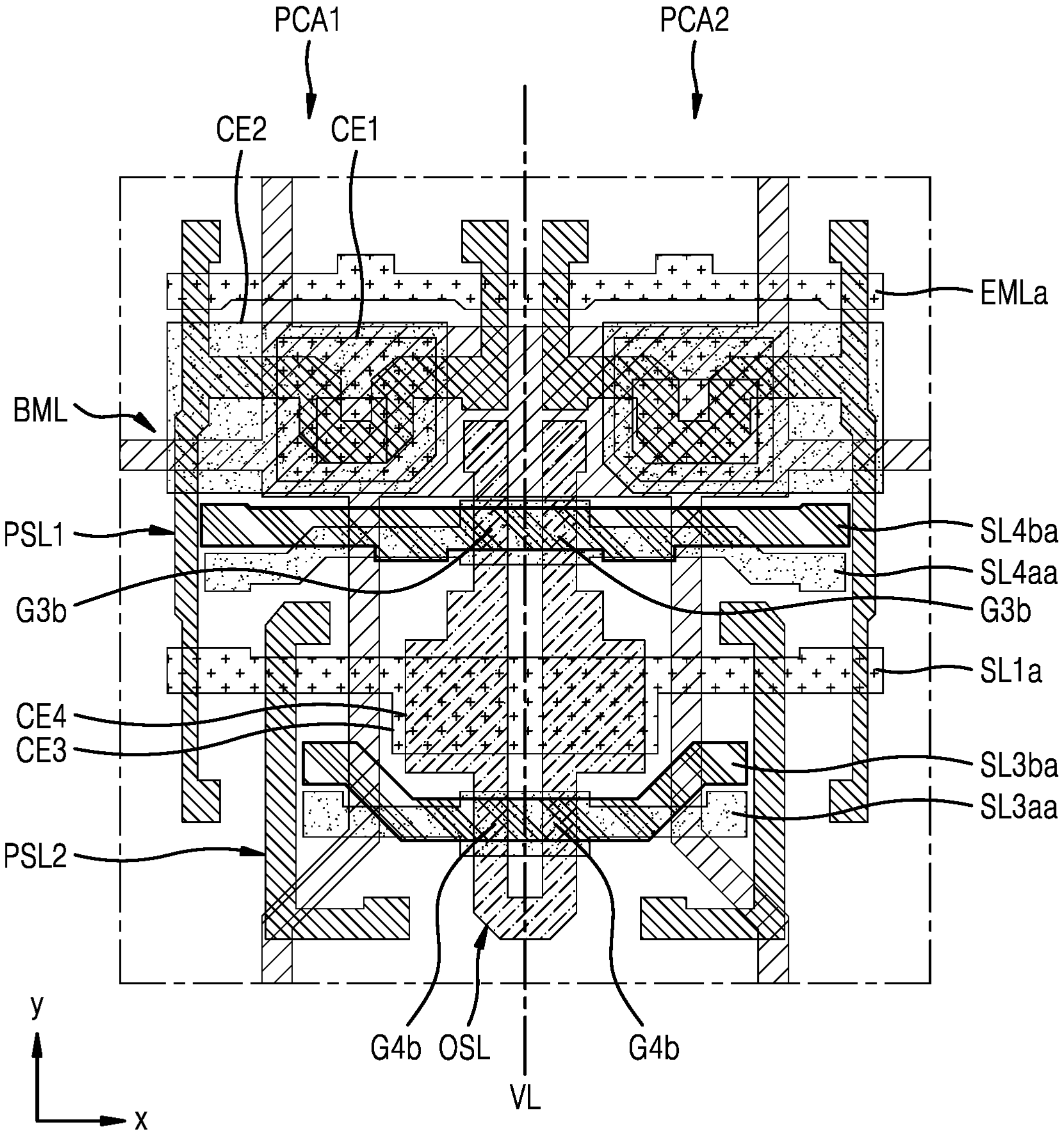
Figure 12:
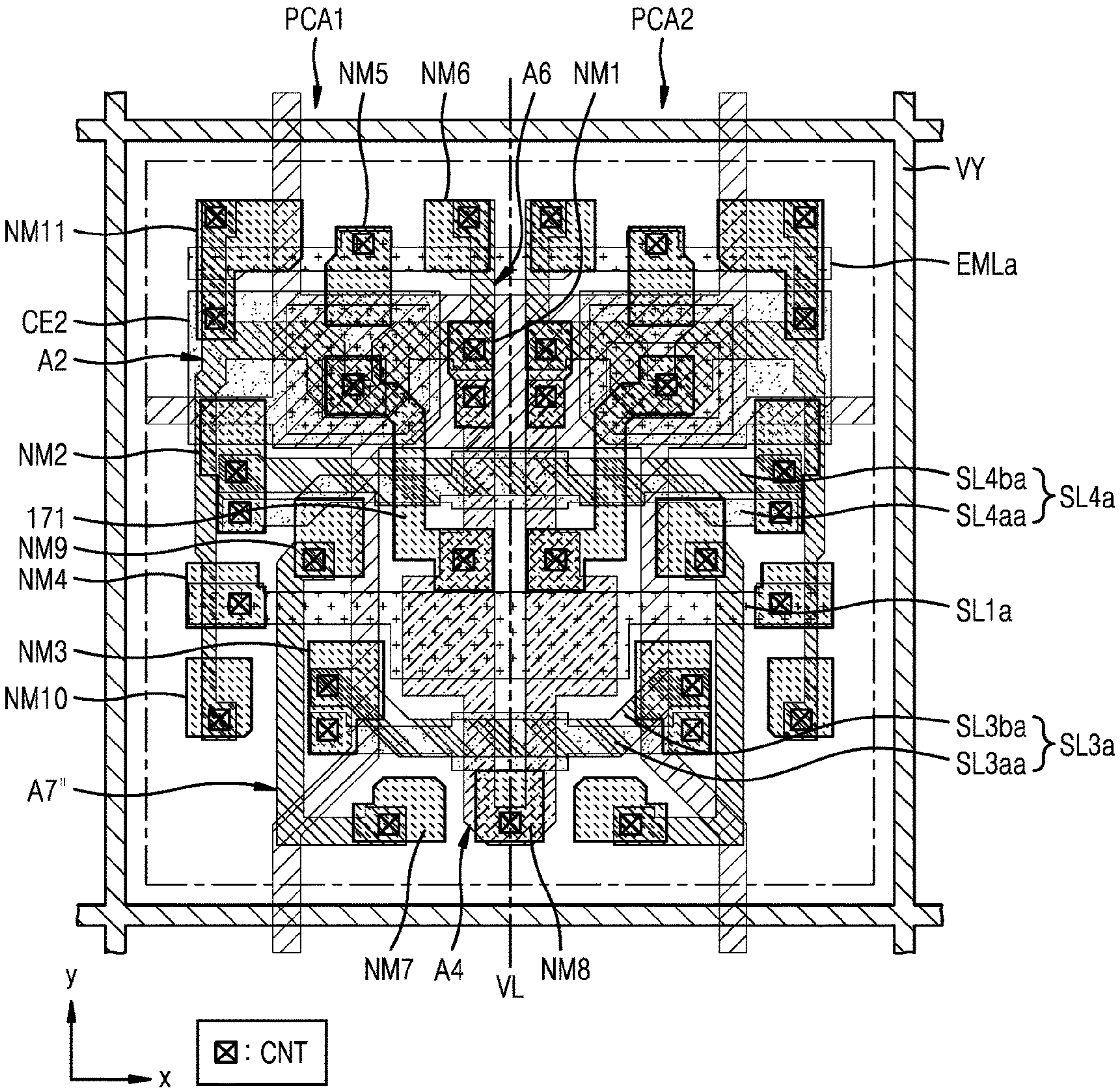
Figure 15:
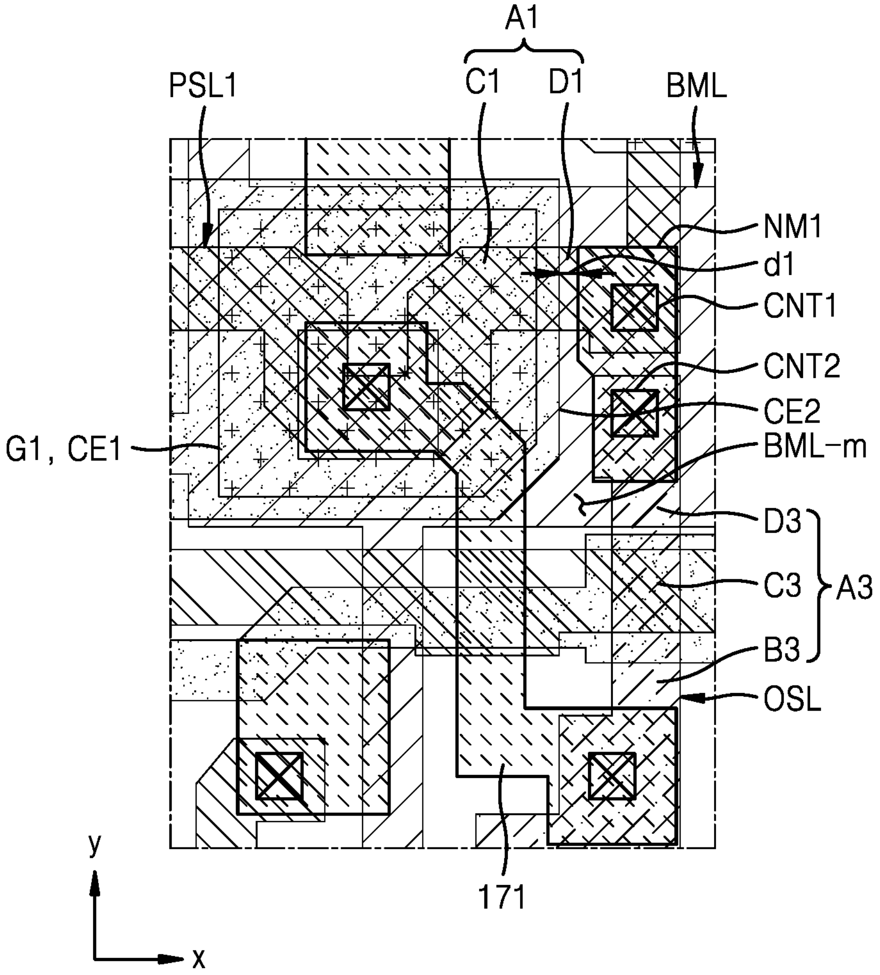
FIG. 15 is an enlarged plan view of a portion of FIG. 12.

FIGS. 6 to 14 are plan views showing a process of forming elements arranged in a display area of a display apparatus in an embodiment, and FIG. 15 is an enlarged plan view of a portion of FIG. 12. For convenience of description, FIGS. 6 to 14 are plan views according to a process of forming elements arranged in the first and second sub-pixel circuit areas PCA1 and PCA2 described above with reference to FIG. 3.

Figure 6:
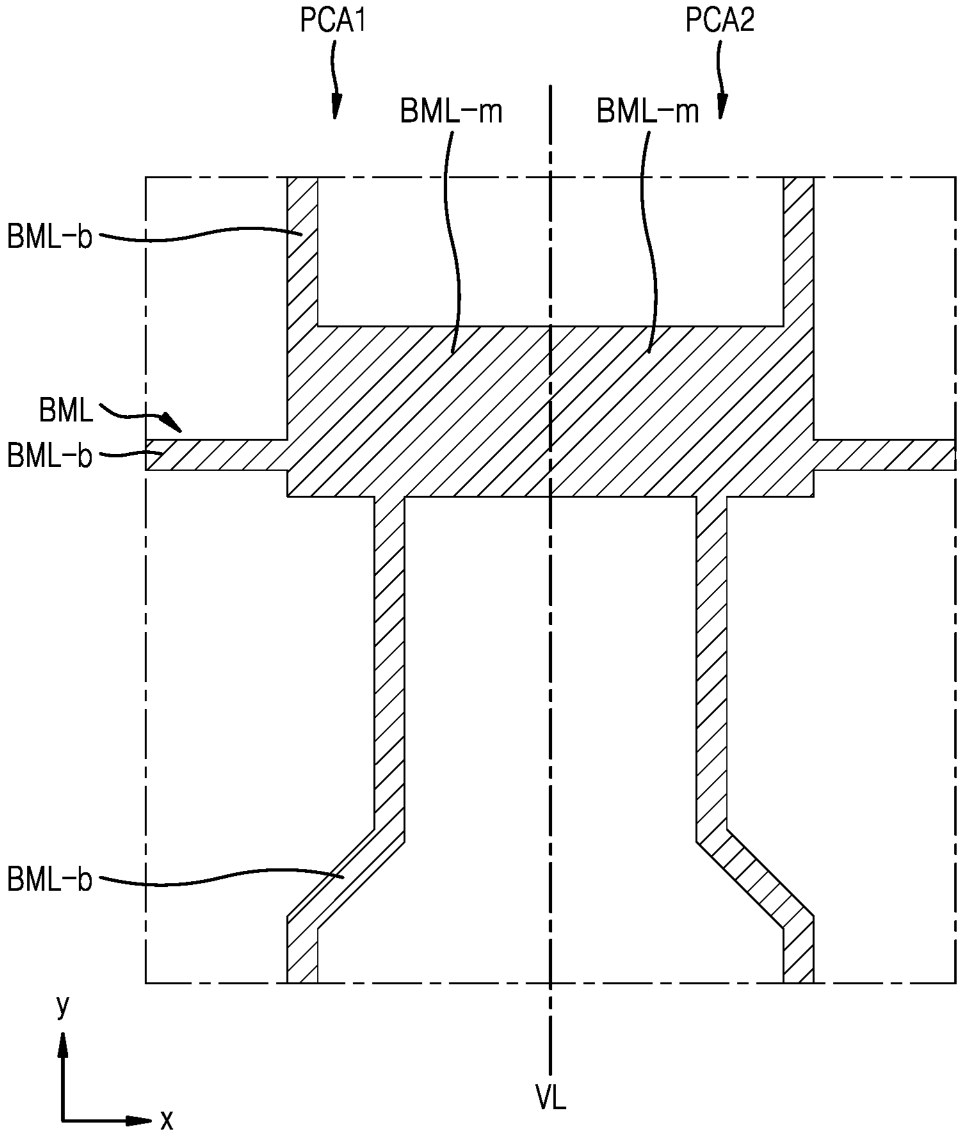
FIGS. 6 to 14 are plan views showing an embodiment of a process of forming elements arranged in a display area of a display apparatus.

Referring to FIGS. 3, 4, and 6, the bottom metal layer BML is formed or disposed on the substrate 100 (refer to FIG. 4). The bottom metal layer BML may include the material described above with reference to FIG. 4. In an embodiment, the bottom metal layer BML may include metal, such as molybdenum, titanium, and aluminum. The bottom metal layer BML may be, e.g., a single molybdenum layer, a double layer of molybdenum and titanium, or a triple layer of a titanium layer, an aluminum layer, and a titanium layer.

As shown in FIG. 6, the bottom metal layer BML may include a portion (hereinafter, also referred to as a main portion BML-m disposed in each of the first and second sub-pixel circuit areas PCA1 and PCA2. The main portion BML-m may be connected to other portions (hereinafter, also referred to as branch portions BML-b) extending in the x direction and the y direction. The main portion BML-m may have a relatively constant width. With regard to this, it is shown in FIGS. 3 and 6 that the width of the main portion BML-m in the x direction and the width of the main portion BML-m in the y direction are relatively constant.

Referring to FIGS. 3 to 6, the bottom metal layers BML arranged in the first and second sub-pixel circuit areas PCA1 and PCA2 may be symmetrical to each other with respect to a virtual line VL between the first and second sub-pixel circuit areas PCA1 and PCA2. The main portion BML-m arranged in the first sub-pixel circuit area PCA1 may be directly connected to the main portion BML-m arranged in the second sub-pixel circuit area PCA2.

In another embodiment, the main portion BML-m arranged in the first sub-pixel circuit area PCA1 may not be directly connected to the main portion BML-m arranged in the second sub-pixel circuit area PCA2, and an additional branch portion having a width less than the width of the main portion BML-m may be arranged between the main portions BML-m. In other words, the main portions BML-m respectively arranged in the adjacent sub-pixel circuits PC may be connected to each other through the additional branch portion.

Figure 7:
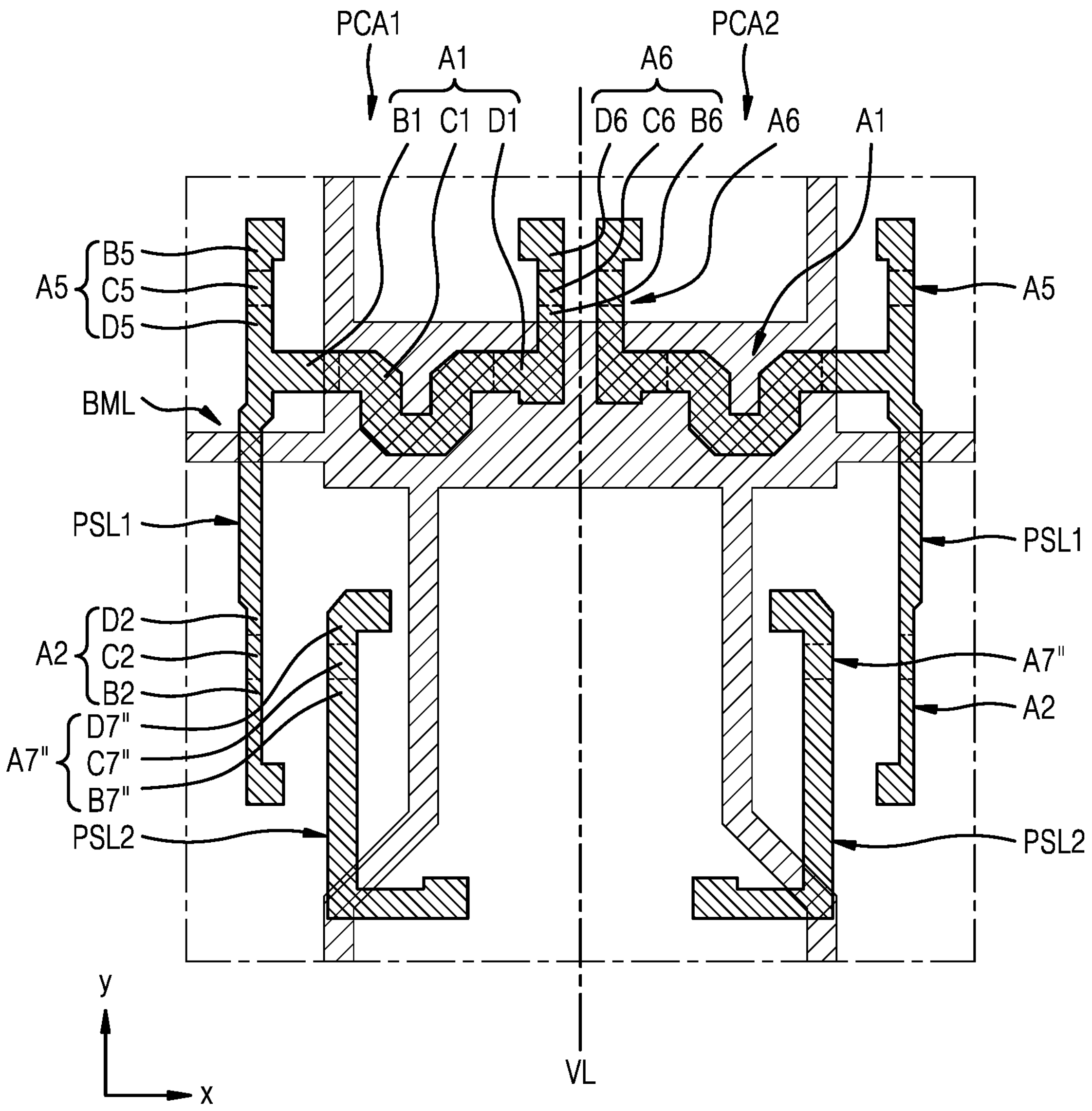

Referring to FIGS. 3, 4, and 7, the buffer layer 111 (refer to FIG. 4) is formed or disposed on the bottom metal layer BML, and then the silicon semiconductor pattern may be formed or disposed. With regard to this, FIG. 7 shows a first silicon semiconductor pattern PSL1 and a second silicon semiconductor pattern PSL2 respectively arranged in the first and second sub-pixel circuit areas PCA1 and PCA2. The first and second sub-pixel circuit areas PCA1 and PCA2 may be symmetrical to each other with respect to a virtual line VL between the first and second sub-pixel circuit areas PCA1 and PCA2. The first silicon semiconductor pattern PSL1 and the second silicon semiconductor pattern PSL2 may each include a silicon-based material, e.g., polycrystalline silicon.

The first silicon semiconductor pattern PSL1 and the second silicon semiconductor pattern PSL2 arranged in the same sub-pixel circuit area may be apart from each other. The first silicon semiconductor pattern PSL1 may be bent in various shapes. The first transistor T1, the second transistor T2, the fifth transistor T5, and the sixth transistor T6 may be formed or disposed along the first silicon semiconductor pattern PSL1. With regard to this, it is shown in FIG. 7 that the first semiconductor layer A1 of the first transistor T1, the second semiconductor layer A2 of the second transistor T2, the fifth semiconductor layer A5 of the fifth transistor T5, and the sixth semiconductor layer A6 of the sixth transistor T6 are arranged along the first silicon semiconductor pattern PSL1. In other words, the first silicon semiconductor pattern PSL1 may include the first semiconductor layer A1, the second semiconductor layer A2, the fifth semiconductor layer A5, and the sixth semiconductor layer A6. The first semiconductor layer A1, the second semiconductor layer A2, the fifth semiconductor layer A5, and the sixth semiconductor layer A6 may be connected to each other, and thus, formed or provided as one body.

The first semiconductor layer A1 may include a first channel region C1, a first region B1, and a second region D1. The first region B1 and the second region D1 are disposed on two opposite sides of the first channel region C1. The first and second regions B1 and D1 of the first semiconductor layer A1 are regions doped with impurities, and have greater electrical conductivity than that of the first channel region C1. One of the first and second regions B1 and D1 may be a source region, and the other may be a drain region. The first channel region C1 may have a bent shape (in an embodiment, have a bent shape of an omega shape) in a plan view. The length of the first channel region C1 may be increased inside a narrow space according to the above-described shape.

The first semiconductor layer A1 may overlap the bottom metal layer BML. In an embodiment, at least one of the first channel region C1, the first region B1, or the second region D1 of the first semiconductor layer A1 may overlap the bottom metal layer BML. In an embodiment, as shown in FIGS. 3 and 6, the first channel region C1 and the second region D1 of the first semiconductor layer A1 may overlap the main portion BML-m, which is a portion of the bottom metal layer BML.

The second semiconductor layer A2 may include a second channel region C2, a first region B2, and a second region D2. The first region B2 and the second region D2 are disposed on two opposite sides of the second channel region C2. The first and second regions B2 and D2 of the second semiconductor layer A2 are regions doped with impurities, and have greater electrical conductivity than that of the second channel region C2. One of the first and second regions B2 and D2 may be a source region, and the other may be a drain region.

The fifth semiconductor layer A5 may include a fifth channel region C5, a first region B5, and a second region D5. The first region B5 and the second region D5 are disposed on two opposite sides of the fifth channel region C5. The first and second regions B5 and D5 of the fifth semiconductor layer A5 are regions doped with impurities, and have greater electrical conductivity than that of the fifth channel region C5. One of the first and second regions B5 and D5 may be a source region, and the other may be a drain region.

The sixth semiconductor layer A6 may include a sixth channel region C6, a first region B6, and a second region D6. The first region B6 and the second region D6 are disposed on two opposite sides of the sixth channel region C6. The first and second regions B6 and D6 of the sixth semiconductor layer A6 are regions doped with impurities, and have greater electrical conductivity than that of the sixth channel region C6. One of the first and second regions B6 and D6 may be a source region, and the other may be a drain region.

In an embodiment, the first region B1 of the first semiconductor layer A1 may be extended, as one body, to the second region D2 of the second semiconductor layer A2 and the second region D5 of the fifth semiconductor layer A5. The second region D1 of the first semiconductor layer A1 may be extended, as one body, to the first region B6 of the sixth semiconductor layer A6.

The seventh transistor T7" described with reference to FIG. 3 may be formed or disposed along the second silicon semiconductor pattern PSL2. With regard to this, it is shown in FIG. 7 that a seventh semiconductor layer A7" of the seventh transistor T7" is formed or disposed along the second silicon semiconductor pattern PSL2. The seventh semiconductor layer A7" of FIG. 7 corresponds to a semiconductor layer of the seventh transistor T7" (refer to FIG. 3) electrically connected to the first to sixth transistors arranged in the sub-pixel circuit area on the (N+1)-th row described above with reference to FIG. 3.

The seventh semiconductor layer A7" may include a seventh channel region C7", a first region B7", and a second region D7". The first region B7" and the second region D7" are disposed on two opposite sides of the seventh channel region C7". The first and second regions B7" and D7" of the seventh semiconductor layer A7" are regions doped with impurities, and have greater electrical conductivity than that of the seventh channel region C7". One of the first and second regions B7" and D7" may be a source region, and the other may be a drain region.

Figure 8:
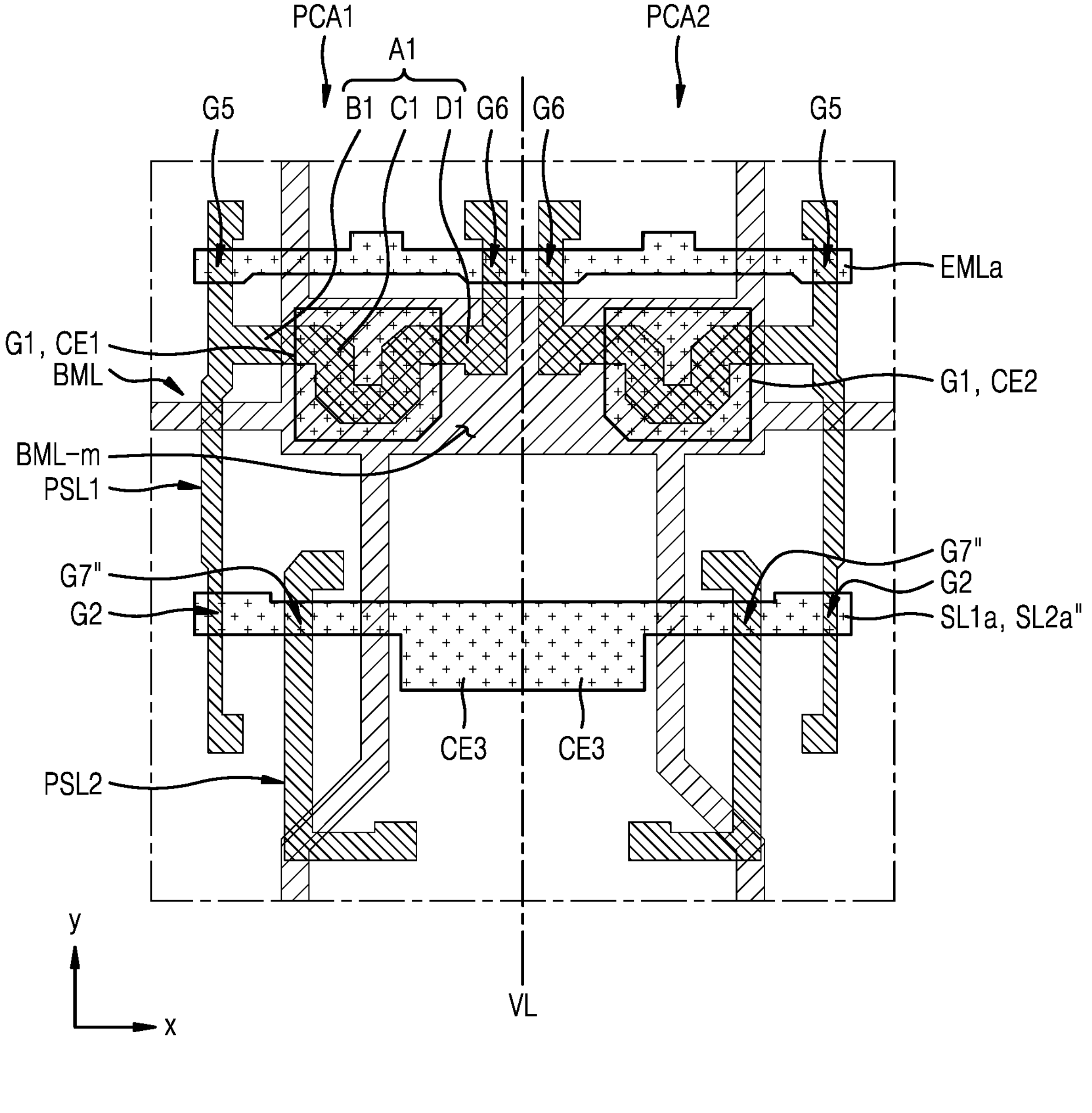

Referring to FIGS. 3, 4, and 8, the first gate insulating layer 112 may be formed or disposed on the first and second silicon semiconductor patterns PSL1 and PSL2. The first gate electrode G1 of the first transistor T1, a second gate electrode G2 of the second transistor T2, a fifth gate electrode G5 of the fifth transistor T5, a sixth gate electrode G6 of the sixth transistor T6, and a seventh gate electrode G7" of the seventh transistor T7" may be disposed on the first gate insulating layer 112. The first capacitor electrode CE1, a first lower scan line SL1*a*, and a lower emission control line EMLa may be disposed on the first gate insulating layer 112.

The first gate electrode G1 has an isolated shape in a plan view, and may include the first capacitor electrode CE1. In other words, the first gate electrode G1 and the first capacitor electrode CE1 may be formed or provided as one body, and it may be represented that the first capacitor electrode CE1 includes the first gate electrode G1.

The first gate electrode G1 and/or the first capacitor electrode CE1 may cover an entirety of the first channel region C1 of the first semiconductor layer A1. The main portion BML-m of the bottom metal layer BML may have a greater area than that of the first gate electrode G1 and/or the first capacitor electrode CE1. The main portion BML-m of the bottom metal layer BML may cover an entirety of the first channel region C1 of the first semiconductor layer A1, and cover an entirety of the second region D1 of the first semiconductor layer A1. The second region D1 is adjacent to the first channel region C1.

The first gate electrode G1 and/or the first capacitor electrode CE1 arranged in each of the first and second sub-pixel circuit areas PCA1 and PCA2 may be symmetrical with respect to a virtual line VL between the first and second sub-pixel circuit areas PCA1 and PCA2. Each of the first lower scan line SL1*a* and the lower emission control line EMLa may extend from the first and second sub-pixel circuit areas PCA1 and PCA2 to cross the virtual line VL.

Each of the first lower scan line SL1*a* and the lower emission control line EMLa may extend in the x direction. The first lower scan line SL1*a* may be apart from the lower emission control line EMLa with the first gate electrode G1 and/or the first capacitor electrode CE1 therebetween in a plan view.

The first lower scan line SL1*a* may include the second gate electrode G2 and the third capacitor electrode CE3. A portion of the first lower scan line SL1*a* may include a portion having a larger width in the y direction than those of other portions. The portion having the relatively larger width may correspond to a third capacitor electrode CE3. The lower emission control line EMLa may include the fifth gate electrode G5 and the sixth gate electrode G6.

The first lower scan line SL1*a* may include the seventh gate electrode G7". The first lower scan line SL1*a* may correspond to a sub-layer (that is, a second lower scan line SL2*a*") of the second scan line of the seventh transistor T7" (refer to FIG. 3) connected to the first to seventh transistors arranged in the sub-pixel circuit area on the (N+1)-th row described above with reference to FIG. 3.

The first lower scan line SL1*a* and the lower emission control line EMLa may each include the same material as that of the first gate electrode G1 and/or the first capacitor electrode CE1, and a predetermined material thereof is the same as that described above with reference to FIG. 4.

Figure 9:
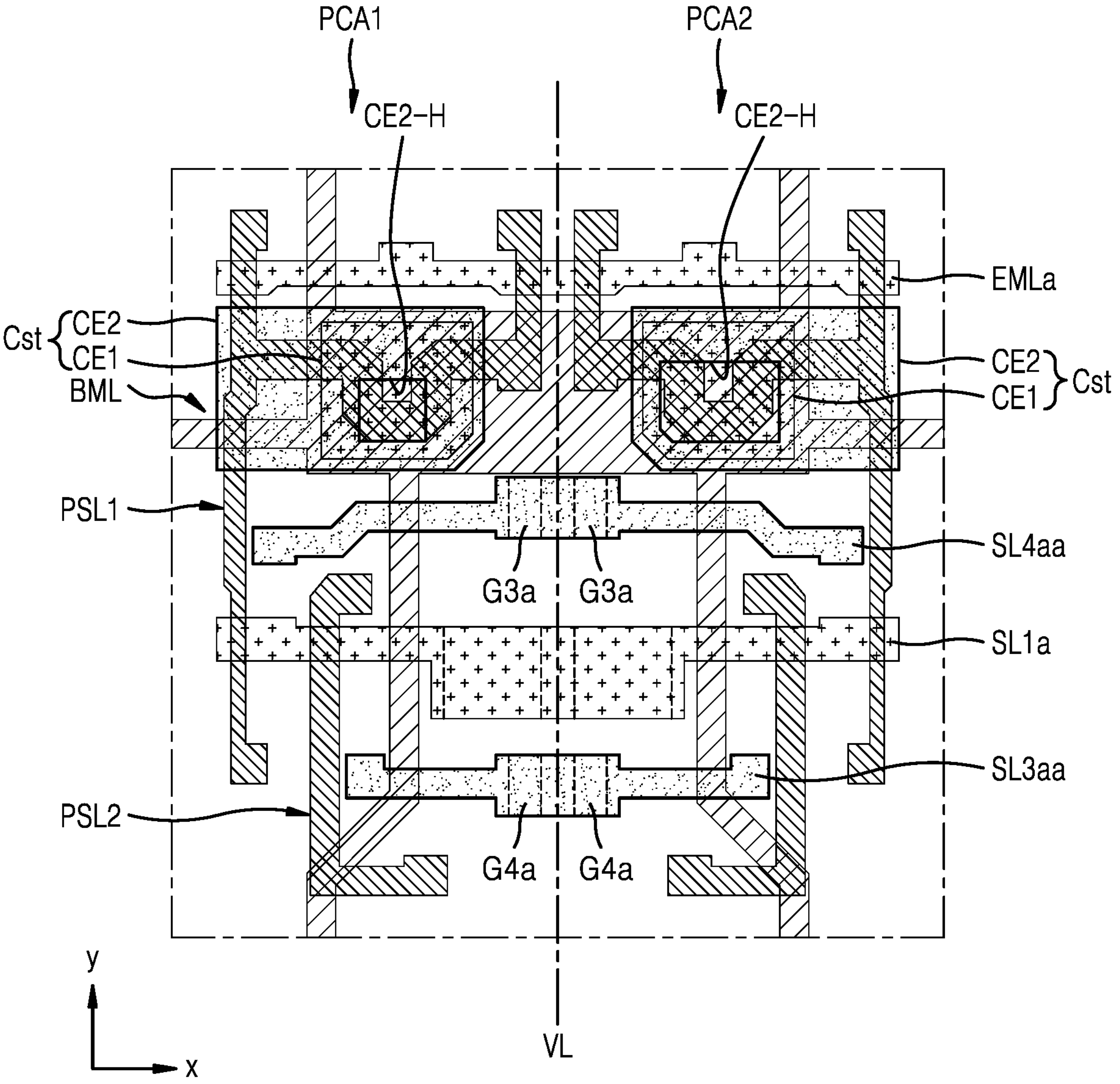

Referring to FIGS. 3, 4, and 9, the first inter-insulating layer 113 (refer to FIG. 4) is formed or provided, and then, the second capacitor electrode CE2, a third lower gate line SL3*aa*, and a fourth lower gate line SL4*aa* may be formed or provided. The second capacitor electrode CE2 arranged in each of the first and second sub-pixel circuit areas PCA1 and PCA2 may be symmetrical with respect to a virtual line VL between the first and second sub-pixel circuit areas PCA1 and PCA2. Each of the third lower gate line SL3*aa* and the fourth lower gate line SL4*aa* may extend from the first and second sub-pixel circuit areas PCA1 and PCA2 to cross the virtual line VL.

The second capacitor electrode CE2 may overlap the first capacitor electrode CE1, and a hole CE2-H that exposes a portion of the first capacitor electrode CE1 may be defined in the second capacitor electrode CE2. In a plan view, an entirety of the hole CE2-H may be surrounded by a material portion forming the second capacitor electrode CE2. The second capacitor electrode CE2 may have a doughnut shape in a plan view. The first capacitor electrode CE1 and the second capacitor electrode CE2 may constitute the first capacitor Cst.

Each of the third lower gate line SL3*aa* and the fourth lower gate line SL4*aa* may extend in the x direction. The third lower gate line SL3*aa* may be apart from the fourth lower gate line SL4*aa* with the first lower scan line SL1*a* therebetween. The fourth lower gate line SL4*aa* may include the third lower gate electrode G3*a*, and the third lower gate line SL3*aa* may include a fourth lower gate electrode G4*a*.

The second capacitor electrode CE2, the third lower gate line SL3*aa*, the fourth lower gate line SL4*aa* may include the same material, and be disposed in the same layer (e.g., the first inter-insulating layer 113 (refer to FIG. 4)). The third lower gate line SL3*aa* and the fourth lower gate line SL4*aa* include the same material as that of the second capacitor electrode CE2 described above with reference to FIG. 4.

Referring to FIGS. 3, 4, and 10, the second inter-insulating layer 114 (refer to FIG. 4) is formed or disposed on the structure of FIG. 9, and then, an oxide semiconductor pattern OSL may be formed or disposed. The oxide semiconductor pattern OSL arranged in each of the first and second sub-pixel circuit areas PCA1 and PCA2 may be symmetrical with respect to a virtual line VL between the first and second sub-pixel circuit areas PCA1 and PCA2.

With regard to this, FIG. 10 shows the oxide semiconductor pattern OSL arranged in each of the first and second sub-pixel circuit areas PCA1 and PCA2. The oxide semiconductor pattern OSL may include an oxide-based semiconductor material, e.g., Zn oxide, In—Zn oxide, Ga—In—Zn oxide, or the like. In an embodiment, the oxide semiconductor pattern OSL may include In—Ga—Zn—O ("IGZO"), In—Sn—Zn—O ("ITZO"), or In—Ga—Sn—Zn—O ("IGTZO") semiconductor including metal, such as indium (In), gallium (Ga), and stannum (Sn) in ZnO.

The oxide semiconductor pattern OSL may include the third semiconductor layer A3 of the third transistor T3 (refer to FIG. 3) and the fourth semiconductor layer A4 of the fourth transistor T4 (refer to FIG. 3). The third semiconductor layer A3 and the fourth semiconductor layer A4 may be connected to each other and formed or provided as one body.

The third semiconductor layer A3 may include the third channel region C3, a first region B3, and a second region D3. The first region B3 and the second region D3 are disposed on two opposite sides of the third channel region C3. The first and second regions B3 and D3 of the third semiconductor layer A3 are regions doped with impurities, and have greater electrical conductivity than that of the third channel region C3. One of the first and second regions B3 and D3 may be a source region, and the other may be a drain region.

The fourth semiconductor layer A4 may include the fourth channel region C4, a first region B4, and a second region D4. The first region B4 and the second region D4 are disposed on two opposite sides of the fourth channel region C4. The first and second regions B4 and D4 of the fourth semiconductor layer A4 are regions doped with impurities, and have greater electrical conductivity than that of the fourth channel region C4. One of the first and second regions B4 and D4 may be a source region, and the other may be a drain region.

The oxide semiconductor pattern OSL may include the fourth capacitor electrode CE4. A portion of the oxide semiconductor pattern OSL that overlaps the third capacitor electrode CE3 (refer to FIG. 8) may correspond to the fourth capacitor electrode CE4. The third capacitor electrode CE3 and the fourth capacitor electrode CE4 may constitute the second capacitor Cbt (refer to FIG. 3).

Though it is shown in FIG. 10 that the oxide semiconductor patterns OSL in each of the first and second sub-pixel circuit areas PCA1 and PCA2 are connected to each other, the embodiment is not limited thereto. In another embodiment, the oxide semiconductor pattern OSL in the first sub-pixel circuit area PCA1 may not be connected to the oxide semiconductor pattern OSL in the second sub-pixel circuit area PCA2.

Referring to FIGS. 3, 4, and 11, a third upper gate line SL3*ba* and a fourth upper gate line SL4*ba* may be formed or disposed on the structure of FIG. 10. Each of a third upper gate line SL3*ba* and the fourth upper gate line SL4*ba* may extend from the first and second sub-pixel circuit areas PCA1 and PCA2 to cross the virtual line VL, and be symmetrical with respect to the virtual line VL.

At least a portion of the fourth upper gate line SL4*ba* may overlap the fourth lower gate line SL4*aa* with the oxide semiconductor pattern OSL therebetween. The fourth upper gate line SL4*ba* includes the third upper gate electrode G3*b*.

At least a portion of the third upper gate line SL3*ba* may overlap the third lower gate line SL3*aa* with the oxide semiconductor pattern OSL therebetween. The third upper gate line SL3*ba* includes the fourth upper gate electrode G4*b*.

The third upper gate line SL3*ba* and the fourth upper gate line SL4*ba* may include the same material as that of the third upper gate electrode G3*b* described above with reference to FIG. 4.

Referring to FIGS. 3, 4, and 12, the third inter-insulating layer 116 (refer to FIG. 4) is formed or disposed on the structure of FIG. 11, and then, first to eleventh connection electrodes NM1, NM2, NM3, NM4, NM5, NM6, NM7, NM8, NM9, NM10, and NM11, and a node connection electrode 171 may be formed or disposed. The first to eleventh connection electrodes NM1, NM2, NM3, NM4, NM5, NM6, NM7, NM8, NM9, NM10, and NM11, and a node connection electrode 171 arranged in each of the first and second sub-pixel circuit areas PCA1 and PCA2 may be symmetrical with respect to the virtual line VL between the first and second sub-pixel circuit areas PCA1 and PCA2.

Referring to FIGS. 12 and 15, the first connection electrode NM1 may electrically connect the first semiconductor layer A1 of the first silicon semiconductor pattern PSL1 to the third semiconductor layer A3 of the oxide semiconductor pattern OSL. As shown in FIG. 15, the first connection electrode NM1 may be connected to the second region D1, which is a portion of the first semiconductor layer A1, through the first contact hole CNT1, and connected to the second region D3, which is a portion of the third semiconductor layer A3, through the second contact hole CNT2.

The first connection point (e.g., the first contact hole CNT1) between the first connection electrode NM1 and the first semiconductor layer A1 is a structurally vulnerable portion. Fine cracks may easily occur in that portion. To prevent fine cracks from occurring and/or prevent fine cracks from propagating to the surroundings even though the fine cracks occur, the bottom metal layer BML may extend below the first connection point between the first connection electrode NM1 and the first semiconductor layer A1. With regard to this, it is shown in FIG. 15 that the main portion BML-m of the bottom metal layer BML overlaps the first channel region C1 of the first semiconductor layer A1, and extends to overlap the first contact hole CNT1, which is the first connection point between the first connection electrode NM1 and the first semiconductor layer A1. The main portion BML-m of the bottom metal layer BML may overlap not only the first channel region C1 and the second region D2 of the first semiconductor layer A1, but the entire area of the first gate electrode G1.

The first connection electrode NM1 may overlap an entirety of the main portion BML-m of the bottom metal layer BML. In an embodiment, the main portion BML-m of the bottom metal layer BML may overlap the second connection point (e.g., the second contact hole CNT2) between the first connection electrode NM1 and the third semiconductor layer A3.

The first connection electrode NM1 is adjacent to second capacitor electrode CE2 but does not overlap the second capacitor electrode CE2. In a plan view, one lateral side of the first connection electrode NM1 may be apart from one lateral side of the second capacitor electrode CE2 by a first distance d1 in the x direction. The first distance d1 is a shortest distance between the first connection electrode NM1 and the second capacitor electrode CE2 and may be equal to or greater than about 0.5 micrometer (μm). To prevent or reduce occurrence of fine cracks due to structural interferences between the first connection electrode NM1 and the second capacitor electrode CE2 therebelow, it may be preferable that the first distance d1 is equal to or greater than about 1 μm.

The node connection electrode 171 may electrically connect the first gate electrode G1 to the first region B3 of the third semiconductor layer A3.

Referring back to FIG. 12, the second connection electrode NM2 may electrically connect the fourth lower gate line SL4*aa* to the fourth upper gate line SL4*ba* by contact holes CNT. The fourth lower gate line SL4*aa* and the fourth upper gate line SL4*ba* may constitute a fourth lower scan line SL4*a*.

The third connection electrode NM3 may electrically connect the third lower gate line SL3*aa* to the third upper gate line SL3*ba* by contact holes CNT. The third lower gate line SL3*aa* and the third upper gate line SL3*ba* may constitute a third lower scan line SL3*a*.

The fourth connection electrode NM4 may be connected to the first lower scan line SL1*a*, and the fifth connection electrode NM5 may be connected to the lower emission control line EMLa. The sixth connection electrode NM6 may be connected to a portion of the sixth semiconductor layer A6, and a seventh connection electrode NM7 may be connected to a portion (e.g., a first region B7" of FIG. 7) of a seventh semiconductor layer A7". The eighth connection electrode NM8 may be connected to a portion of the fourth semiconductor layer A4. The ninth connection electrode NM9 may be connected to another portion (e.g., the second region D7" of FIG. 7) of the seventh semiconductor layer A7". The tenth connection electrode NM10 may be connected to the second semiconductor layer A2, and the eleventh connection electrode NM11 may be connected to the second capacitor electrode CE2.

The first and second sub-pixel circuit areas PCA1 and PCA2 may be surrounded by the valley VY in a plan view. The valley VY of FIG. 12 is the valley VY described above with reference to FIG. 4 or 5. The valley VY defined by removing a portion of each of the inorganic insulating layers may be partially filled with an organic insulating material.

Referring to FIGS. 3, 4, 12, and 13, the first organic insulating layer 121 (refer to FIG. 4) is formed or disposed on the structure of FIG. 12, and then, a first upper scan line SL1*b*, a third upper scan line SL3*b*, a fourth upper scan line SL4*b*, an upper emission control line ELMb, the first initialization voltage line VIL1, a second initialization voltage line VIL2", a 20-th connection electrode NM20, and a 21st connection electrode NM21 may be formed or disposed. The first upper scan line SL1*b*, the third upper scan line SL3*b*, the fourth upper scan line SL4*b*, the upper emission control line ELMb, the first initialization voltage line VIL1, the second initialization voltage line VIL2" may extend in the x direction to cross the virtual line VL.

The first upper scan line SL1*b* may be connected to the fourth connection electrode NM4 (refer to FIG. 12). The first upper scan line SL1*b* may be electrically connected to the first lower scan line SL1*a* (refer to FIG. 12) through the fourth connection electrode NM4 (refer to FIG. 12). The first lower scan line SL1*a* shown in FIG. 12 may extend in the x direction and have an isolated shape, and thus, two opposite ends of the first lower scan line SL1*a* does not extend beyond the valley VY. In contrast, the first upper scan line SL1*b* shown in FIG. 13 may extend in the x direction and cross the valley VY. The first lower scan line SL1*a* may be electrically connected to another first lower scan line arranged on the same row with the valley VY therebetween, through the first upper scan line SL1*b*.

The third upper scan line SL3*b* may be connected to the third connection electrode NM3 (refer to FIG. 12). The third upper scan line SL3*b* may be electrically connected to the third lower scan line SL3*a* (refer to FIG. 12) through the third connection electrode NM3 (refer to FIG. 12). The third lower scan line SL3*a* shown in FIG. 12 may extend in the x direction and have an isolated shape, and thus, two opposite ends of the third lower scan line SL3*a* does not extend beyond the valley VY. In contrast, the third upper scan line SL3*b* shown in FIG. 13 may extend in the x direction and cross the valley VY. The third lower scan line SL3*a* may be electrically connected to another third lower scan line arranged on the same row with the valley VY therebetween, through the third upper scan line SL3*b*.

The fourth upper scan line SL4*b* may be connected to the second connection electrode NM2 (refer to FIG. 12). The fourth upper scan line SL4*b* may be electrically connected to the fourth lower scan line SL4*a* (refer to FIG. 12) through the second connection electrode NM2 (refer to FIG. 12). The fourth lower scan line SL4*a* shown in FIG. 12 may extend in the x direction and have an isolated shape in a plan view, and thus, two opposite ends of the fourth lower scan line SL4*a* does not extend beyond the valley VY. In contrast, the fourth upper scan line SL4*b* shown in FIG. 13 may extend in the x direction and cross the valley VY. The fourth lower scan line SL4*a* may be electrically connected to another fourth lower scan line arranged on the same row with the valley VY therebetween, through the fourth upper scan line SL4*b*.

The upper emission control line ELMb may be connected to the fifth connection electrode NM5 (refer to FIG. 12). The upper emission control line ELMb may be electrically connected to the lower emission control line EMLa (refer to FIG. 12) through the fifth connection electrode NM5 (refer to FIG. 12). The lower emission control line EMLa shown in FIG. 12 may extend in the x direction and have an isolated shape, and thus, two opposite ends of the lower emission control line EMLa does not extend beyond the valley VY. In contrast, the upper emission control line ELMb shown in FIG. 13 may extend in the x direction and cross the valley VY. The lower emission control line EMLa may be electrically connected to another emission control line EMLa arranged on the same row with the valley VY therebetween, through the upper emission control line ELMb.

The first initialization voltage line VIL1 may be connected to the eighth connection electrode NM8 (refer to FIG. 12), and the second initialization voltage line VIL2" may be connected to the ninth connection electrode NM9 (refer to FIG. 12). The first initialization voltage line VIL1 may provide a first initialization signal to the fourth transistor T4 (refer to FIG. 3). The second initialization voltage line VIL2" may provide a second initialization signal to the seventh transistor T7" (refer to FIG. 3).

The 20-th connection electrode NM20 may be connected to the tenth connection electrode NM10 (refer to FIG. 12), and the 21st connection electrode NM21 may be connected to the eleventh connection electrode NM11 (refer to FIG. 12). The connection line ML may be connected to the sixth connection electrode NM6 (refer to FIG. 12). The connection line ML extends in the y direction for electrical connection of the sixth transistor T6 (refer to FIG. 3) and the seventh transistor T7 (refer to FIG. 3). The sixth transistor T6 is arranged in the first and/or second sub-pixel circuit areas PCA1 and PCA2 in Nth row in FIG. 3, and the seventh transistor T7 is arranged on the (N−1)-th row described above with reference to FIG. 3. Another connection line ML" extends in the y direction to electrically connect the seventh transistor T7 to the sixth transistor T6. The seventh transistor T7" arranged on the N-th row and arranged in the first and/or second sub-pixel circuit areas PCA1 and PCA2, and the sixth transistor T6 is arranged on the (N+1)-th row.

The first upper scan line SL1*b*, the third upper scan line SL3*b*, the fourth upper scan line SL4*b*, the upper emission control line ELMb, the first initialization voltage line VIL1, the second initialization voltage line VIL2", the connection lines ML and ML", the 20-th connection electrode NM20, the 21st connection electrode NM21 may each include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and include a single layer or a multi-layer including the above materials. In an embodiment, the first upper scan line SL1*b*, the third upper scan line SL3*b*, the fourth upper scan line SL4*b*, the upper emission control line ELMb, the first initialization voltage line VIL1, the second initialization voltage line VIL2", the connection lines ML and ML", the 20-th connection electrode NM20, the 21st connection electrode NM21 may each have a triple-layered structure in which a titanium layer, an aluminum layer, and a titanium layer are stacked.

Figure 13:
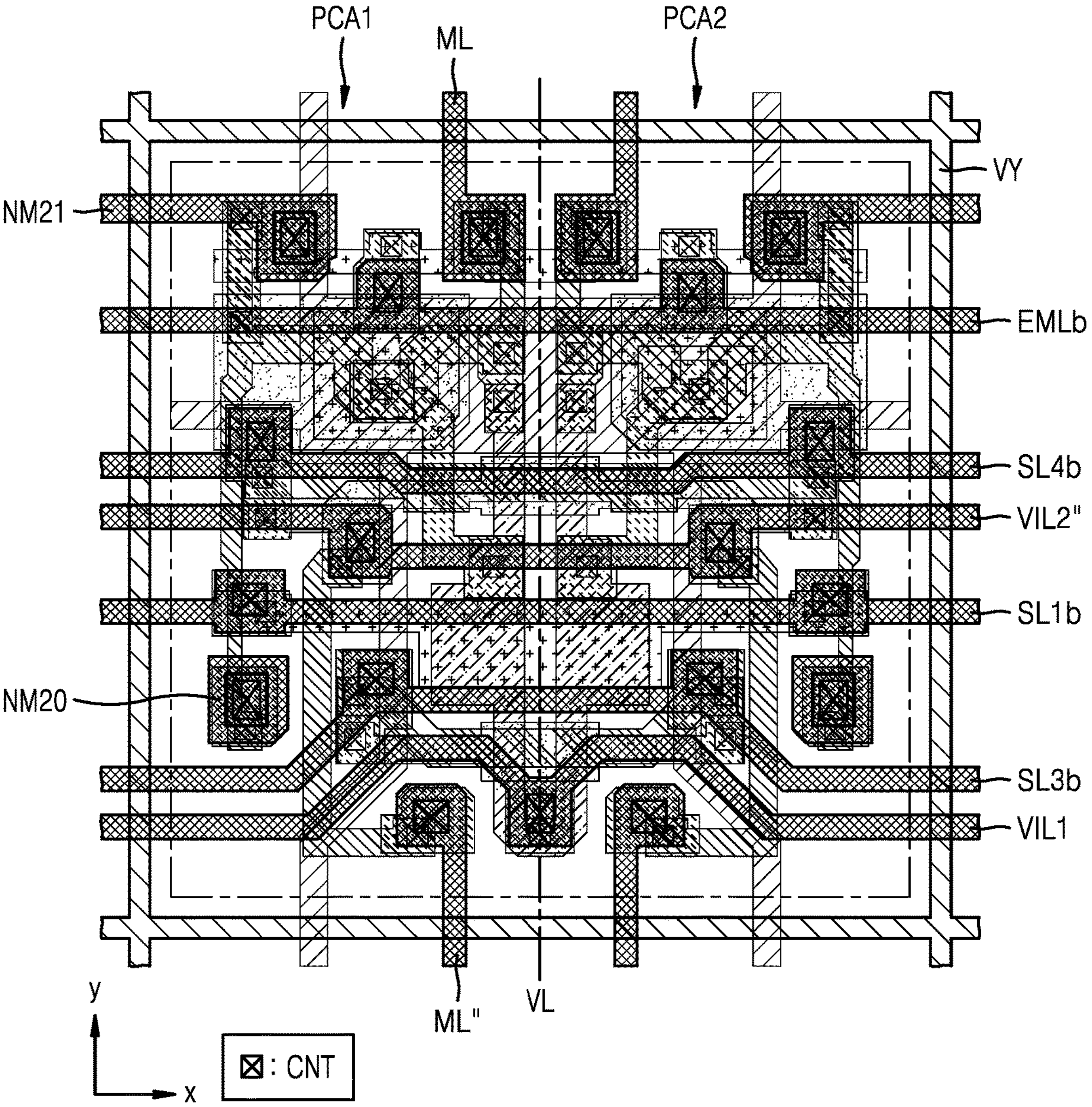
Figure 14:
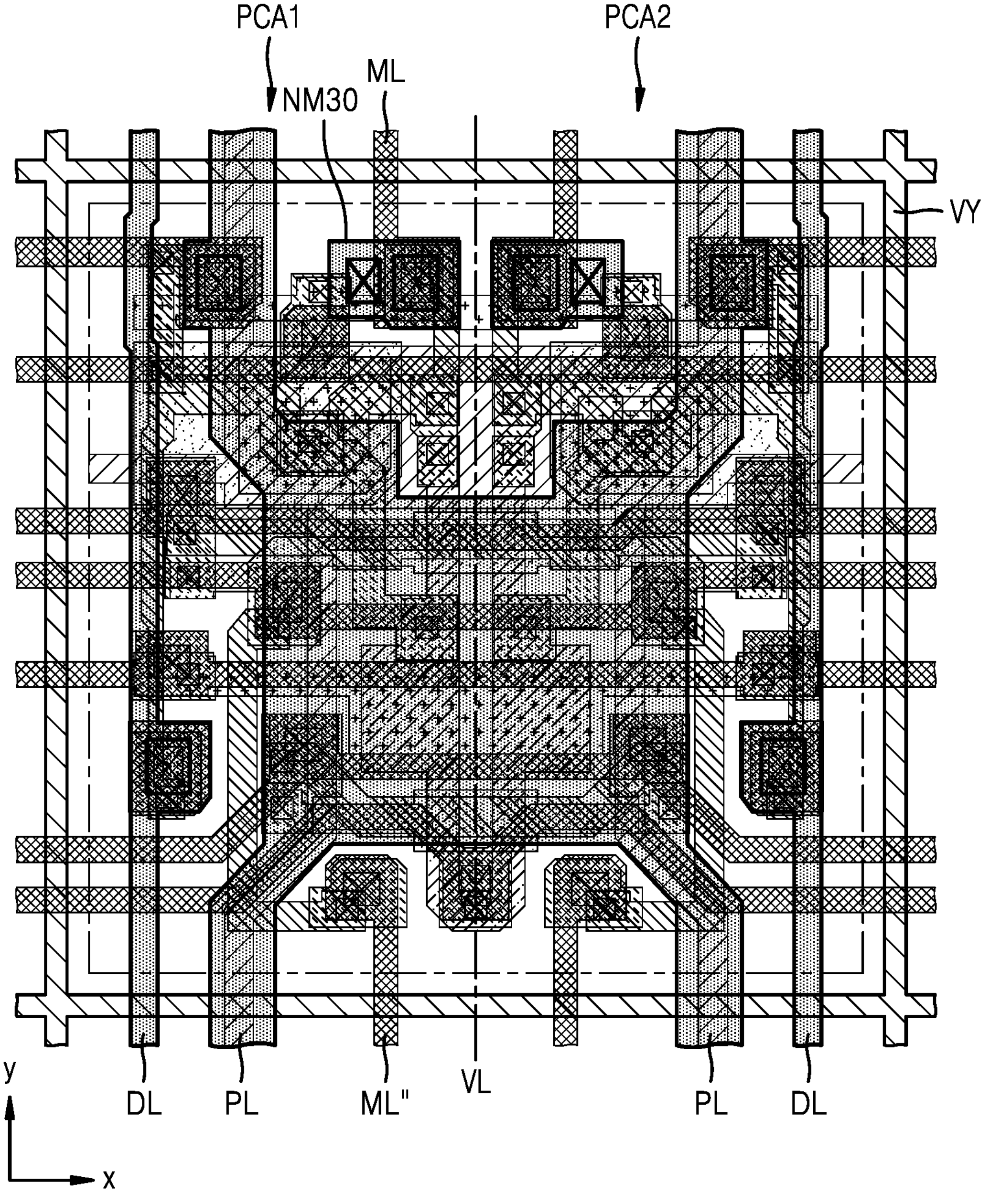

Referring to FIGS. 3, 4, 13, and 14, the second organic insulating layer 123 (refer to FIG. 4) is formed or disposed on the structure of FIG. 13, and then, the data line DL, the driving voltage line PL, and a 30-th connection electrode NM30 are formed or disposed. The data line DL and the driving voltage line PL may extend in the y direction.

The data line DL is connected to the 20-th connection electrode NM20 (refer to FIG. 13). The data line DL may provide data signals to the second semiconductor layer A2 (refer to FIG. 12) through the 20-th connection electrode NM20 (refer to FIG. 13) and the tenth connection electrode NM10 (refer to FIG. 12) therebelow.

The driving voltage line PL is connected to the 21st connection electrode NM21 (refer to FIG. 13). The driving voltage line PL may be electrically connected to the second capacitor electrode CE2 (refer to FIG. 12) through the 21st connection electrode NM21 (refer to FIG. 13) and the eleventh connection electrode NM11 therebelow (refer to FIG. 12).

The 30-th connection electrode NM30 is connected to the connection line ML. The 30-th connection electrode NM30 may be connected to the first electrode 210 (refer to FIG. 4) of the light-emitting diode described with reference to FIG. 4.

The data line DL and the driving voltage line PL may extend in they direction across the valley VY. The data line DL and the driving voltage line PL may each include aluminum (Al), platinum (Pt), palladium (Pd), silver (Ag), magnesium (Mg), gold (Au), Nickel (Ni), neodymium (Nd), iridium (Ir), chrome (Cr), lithium (Li), calcium (Ca), molybdenum (Mo), titanium (Ti), tungsten (W), and/or copper (Cu), and include a single layer or a multi-layer including the above materials. In an embodiment, the data line DL, the driving voltage line PL, and the connection lines ML and ML" may each have a structure in which a titanium layer, an aluminum layer, and a titanium layer are stacked.

In an embodiment, occurrence of fine cracks may be reduced by reducing a display transformation rate due to external impacts. Even when fine cracks occur, propagation of the fine cracks to the surroundings may be reduced. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:

a substrate;

a first silicon-based transistor disposed over the substrate and including a first semiconductor layer and a first gate electrode which overlap each other, the first semiconductor layer including:

a silicon-based semiconductor;

at least one insulating layer on the first gate electrode;

a first oxide-based transistor including a semiconductor layer on the at least one insulating layer, the semiconductor layer including:

an oxide-based semiconductor;

a first connection electrode electrically connecting the first semiconductor layer of the first silicon-based transistor to the semiconductor layer of the first oxide-based transistor; and a bottom metal layer disposed between the substrate and the first silicon-based transistor and overlapping the first semiconductor layer of the first silicon-based transistor, wherein a portion of the bottom metal layer overlaps a first connection point between a portion of the first semiconductor layer and the first connection electrode, wherein the first semiconductor layer includes a channel region which is bent, and a drain region arranged on one side of the channel region and connected to the first connection electrode, and wherein the portion of the bottom metal layer overlaps the channel region of the first semiconductor layer which is bent, and the drain region.

2. The display apparatus of claim 1, wherein the bottom metal layer has a voltage level of a constant voltage.

3. The display apparatus of claim 1, further comprising a plurality of inorganic insulating layers between the substrate and the first connection electrode, wherein the plurality of inorganic insulating layers includes the at least one insulating layer, and a valley having a first depth is defined in the plurality of inorganic insulating layers in a thickness direction.

4. The display apparatus of claim 3, wherein at least a portion of the valley is filled with an organic insulating material.

5. The display apparatus of claim 3, further comprising:

a second silicon-based transistor including a second semiconductor layer and a second gate electrode, wherein the second semiconductor layer includes a silicon-based semiconductor, and the second gate electrode overlaps the second semiconductor layer; and a first lower scan line electrically connected to the second gate electrode of the second silicon-based transistor, wherein the first lower scan line has an isolated shape in a plan view and is electrically connected to a first upper scan line disposed on the first lower scan line and crossing the valley in the plan view.

6. The display apparatus of claim 1, further comprising a storage capacitor including a first capacitor electrode and a second capacitor electrode which overlap each other on the first silicon-based transistor, wherein the at least one insulating layer includes:

a first inter-insulating layer between the first capacitor electrode and the second capacitor electrode; and a second inter-insulating layer over the first inter-insulating layer, and wherein the second capacitor electrode is disposed under the second inter-insulating layer, and the semiconductor layer of the first oxide-based transistor is disposed on the second inter-insulating layer.

7. The display apparatus of claim 6, wherein the second capacitor electrode is adjacent to the first connection electrode and does not overlap the first connection electrode in a plan view.

8. The display apparatus of claim 7, wherein a distance between one lateral side of the second capacitor electrode and one lateral side of the first connection electrode adjacent to each other is equal to or greater than about 0.5 micrometer in the plan view.

9. A display apparatus comprising:

a substrate;

a bottom metal layer disposed on the substrate;

a first silicon-based semiconductor pattern disposed on the bottom metal layer and including a first semiconductor layer;

an oxide-based semiconductor pattern apart from the first silicon-based semiconductor pattern; and a first connection electrode electrically connecting a portion of the first silicon-based semiconductor pattern to a portion of the oxide-based semiconductor pattern, wherein a portion of the bottom metal layer overlaps a connection point between the portion of the first silicon-based semiconductor pattern and the first connection electrode, wherein the first semiconductor layer of the first silicon-based semiconductor pattern includes a channel region which is bent and an impurity region, the impurity region being arranged on one side of the channel region, and being connected to the first connection electrode, and wherein the portion of the bottom metal layer overlaps the channel region of the first semiconductor layer which is bent and the impurity region.

10. The display apparatus of claim 9, wherein the portion of the bottom metal layer overlaps a second connection point between the first connection electrode and the oxide-based semiconductor pattern.

11. The display apparatus of claim 9, wherein the bottom metal layer has a voltage level of a constant voltage.

12. The display apparatus of claim 9, further comprising a plurality of inorganic insulating layers between the substrate and the first connection electrode, wherein a valley having a first depth is defined in the plurality of inorganic insulating layers in a thickness direction.

13. The display apparatus of claim 12, wherein at least a portion of the valley is filled with an organic insulating material.

14. The display apparatus of claim 12, further comprising a first lower scan line on the first silicon-based semiconductor pattern, wherein the first silicon-based semiconductor pattern further includes a second semiconductor layer connected to the first semiconductor layer, and the first lower scan line overlaps a portion of the second semiconductor layer.

15. The display apparatus of claim 14, wherein the first lower scan line is electrically connected to a first upper scan line disposed on the first lower scan line and crossing the valley in a plan view.

16. The display apparatus of claim 9, further comprising a first capacitor overlapping the first semiconductor layer of the first silicon-based semiconductor pattern, wherein the first capacitor includes a first capacitor electrode and a second capacitor electrode on the first capacitor electrode.

17. The display apparatus of claim 16, wherein the second capacitor electrode is adjacent to the first connection electrode and does not overlap the first connection electrode in a plan view.

* * * * *